US012188997B2

(12) United States Patent
Kameno et al.

(10) Patent No.: US 12,188,997 B2
(45) Date of Patent: Jan. 7, 2025

(54) MAGNETIC FIELD DETECTION DEVICE AND MAGNETIC FIELD DETECTION DEVICE ARRAY

(71) Applicant: TDK Corporation, Tokyo (JP)

(72) Inventors: Makoto Kameno, Tokyo (JP); Taiju Akushichi, Tokyo (JP); Takato Fukui, Tokyo (JP); Yuichiro Yamaji, Tokyo (JP); Osamu Harakawa, Tokyo (JP); Tamon Kasajima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 130 days.

(21) Appl. No.: 17/928,852

(22) PCT Filed: May 27, 2021

(86) PCT No.: PCT/JP2021/020251
§ 371 (c)(1),
(2) Date: Nov. 30, 2022

(87) PCT Pub. No.: WO2021/246289
PCT Pub. Date: Dec. 9, 2021

(65) Prior Publication Data
US 2023/0176145 A1 Jun. 8, 2023

(30) Foreign Application Priority Data

Jun. 3, 2020 (JP) ................. 2020-096653

(51) Int. Cl.
G01R 33/025 (2006.01)
G01R 33/09 (2006.01)
(52) U.S. Cl.
CPC ........... G01R 33/025 (2013.01); G01R 33/09 (2013.01)

(58) Field of Classification Search
CPC .. G01R 33/025; G01R 33/00; G01R 33/0047; G01R 33/0094; G01R 33/0005; G01R 33/0017; H10N 50/10
(Continued)

(56) References Cited

U.S. PATENT DOCUMENTS 3,445,928 A * 5/1969 Beynon ................. G01R 33/05
335/297
5,113,136 A * 5/1992 Hayashi ............... G01R 33/025
324/225
(Continued)

FOREIGN PATENT DOCUMENTS

JP 2005-016960 A 1/2005
JP 2013-124873 A 6/2013
(Continued)

OTHER PUBLICATIONS

International Search Report issued in corresponding International Patent Application No. PCT/JP2021/020251, dated Jul. 27, 2021, with English translation.
(Continued)

Primary Examiner — Christopher P McAndrew
(74) Attorney, Agent, or Firm — Rimon P.C.

(57) ABSTRACT

To facilitate a change in the number and layout of magnetic field detection devices to be arranged in an array. A magnetic field detection device includes a cancel coil wound around a bobbin, a cover member fixed to the bobbin and covering the cancel coil in a direction perpendicular to the axial direction of the cancel coil, and magnetic sensors fixed to the bobbin or cover member. The cover member has side surfaces and extending in the z-direction and positioned on mutually opposite sides. The side surfaces have first and second engagement portions, respectively, and the first engagement portion has a shape engageable with the shape of the second engagement portion. This makes it possible to
(Continued)

arrange a desired number of the magnetic field detection devices.

19 Claims, 18 Drawing Sheets

(58) Field of Classification Search
USPC .......................................................... 324/252
See application file for complete search history.

(56) References Cited

U.S. PATENT DOCUMENTS

| | | | | |
|---|---|---|---|---|
| 5,537,037 | A * | 7/1996 | Otaka | G01N 27/902 |
| | | | | 324/225 |
| 7,535,363 | B2 * | 5/2009 | Gisselberg | A61B 90/39 |
| | | | | 343/750 |
| 2003/0016010 | A1 * | 1/2003 | Kandori | A61B 5/242 |
| | | | | 600/409 |
| 2004/0263162 | A1 | 12/2004 | Kandori et al. | |
| 2007/0188168 | A1 * | 8/2007 | Stanley | G01R 33/09 |
| | | | | 324/228 |
| 2009/0201016 | A1 * | 8/2009 | Hattersley | G01R 33/1215 |
| | | | | 324/239 |
| 2013/0015702 | A1 | 1/2013 | Ito | |
| 2014/0077612 | A1 | 3/2014 | Onuma et al. | |
| 2017/0219661 | A1 | 8/2017 | Hata et al. | |
| 2018/0137969 | A1 | 5/2018 | Hamamura et al. | |
| 2019/0167136 | A1 | 6/2019 | Kawabata | |
| 2019/0277888 | A1 * | 9/2019 | Gutierrez Hernandez | ............... |
| | | | | H01F 27/325 |

FOREIGN PATENT DOCUMENTS

| | | |
|---|---|---|
| JP | 2015-210251 A | 11/2015 |
| JP | 2017-133993 A | 8/2017 |
| JP | 2019-211405 A | 12/2019 |
| JP | 2020-071198 A | 5/2020 |
| WO | 2018/025829 A1 | 2/2018 |

OTHER PUBLICATIONS

Extended European Search Report dated on Jun. 12, 2024 issued in the corresponding European Patent Application No. 21818582.5.

* cited by examiner

MAGNETIC FIELD DETECTION DEVICE AND MAGNETIC FIELD DETECTION DEVICE ARRAY

CROSS REFERENCE TO RELATED APPLICATIONS

This application is the U.S. National Phase under 35 U.S.C. § 371 of International Application No. PCT/JP2021/020251, filed on May 27, 2021, which claims the benefit of Japanese Patent Application No. 2020-096653, filed on Jun. 3, 2020, the entire contents of each are hereby incorporated by reference.

TECHNICAL FIELD

The present invention relates to a magnetic field detection device and, more particularly, to a magnetic field detection devices capable of being arranged in an array.

BACKGROUND ART

Patent Document 1 discloses in FIG. 12 a magnetic field detection device array that can measure in-plane magnetic field distribution by arranging a plurality of magnetic field detection devices in an array.

CITATION LIST

Patent Document

[Patent Document 1] JP 2017-133993A

SUMMARY OF THE INVENTION

Problem to be Solved by the Invention

However, in the magnetic field detection device array disclosed in FIG. 12 of Patent Document 1, it is not easy to change the number and layout of the magnetic field detection devices.

It is therefore an object of the present invention to facilitate a change in the number and layout of the magnetic field detection devices to be arranged in an array.

Means for Solving the Problem

A magnetic field detection device according to the present invention includes: a bobbin; a cancel coil wound around the bobbin; a cover member fixed to the bobbin and covering the cancel coil in a direction perpendicular to the axial direction of the cancel coil; and a first magnetic sensor fixed to the bobbin or cover member. The cover member has first and second side surfaces extending in the axial direction of the cancel coil and positioned on mutually opposite sides. The first and second side surfaces have first and second engagement portions, respectively. The first engagement portion has a shape engageable with the shape of the second engagement portion.

According to the present invention, the cover member covering the cancel coil in a direction perpendicular to the axial direction has the first and second engagement positions, so that it is possible to arrange a desired number of the magnetic field detection devices in a first direction perpendicular to the first and second side surfaces.

In the present invention, the cover member may have third and fourth side surfaces extending in the axial direction of the cancel coil and positioned on mutually opposite sides, the third and fourth side surfaces may have third and fourth engagement portions, respectively, and the third engagement portion may have a shape engageable with the shape of the fourth engagement portion. This makes it possible to arrange a desired number of the magnetic field detection devices in a second direction perpendicular to the third and fourth side surfaces. In this case, the first and second side surfaces may be perpendicular to the third and fourth side surfaces. With this configuration, by engaging the first and second engagement portions of two magnetic field detection devices adjacent to each other in the first direction and engaging the third and fourth engagement portions of two magnetic field detection devices adjacent to each other in the second direction, it is possible to constitute a magnetic field detection device array in which a plurality of the magnetic field detection devices are arranged in a matrix.

In the present invention, the cover member may have fifth and sixth side surfaces extending in the axial direction of the cancel coil and positioned on mutually opposite sides, the fifth and sixth side surfaces may have fifth and sixth engagement portions, respectively, the fifth engagement portion may have a shape engageable with the shape of the sixth engagement portion, and the first and second side surfaces, the third and fourth side surface, and the fifth and sixth side surfaces may form an angle of 60° with one another. With this configuration, by engaging the first and second engagement portions of two magnetic field detection devices adjacent to each other in the first direction, engaging the third and fourth engagement portions of two magnetic field detection devices adjacent to each other in the second direction, and engaging the fifth and sixth engagement portions of two magnetic field detection devices adjacent to each other in a third direction, it is possible to constitute a magnetic field detection device array in which a plurality of the magnetic field detection devices are arranged in a honeycomb pattern.

The magnetic field detection device according to the present invention may further include a second magnetic sensor fixed to the bobbin or cover member and a feedback circuit that makes a cancel current flow in the cancel coil according to an output signal of the second magnetic sensor to cancel an environmental magnetic field in a cancel space, and the first magnetic sensor may be disposed in the cancel space. This makes it possible to cancel a uniform environmental magnetic field component such as terrestrial magnetism. In addition, the cancel coil is used in common for the first and second magnetic sensors, so that it is possible to reduce the number of components to be used and to simplify the circuit configuration.

In the present invention, sensor heads of the first and second magnetic sensors may be different in position in the axial direction of the cancel coil. This makes it possible to prevent a signal magnetic field component from being cancelled by the cancel coil. In this case, a winding core part of the bobbin may have a first cavity opened at one side thereof in the axial direction and a second cavity opened at the other side thereof in the axial direction, and the first and second magnetic sensors may be installed in the first and second cavities, respectively. This makes it possible to sufficiently separate the first and second magnetic sensors from each other. Further, in this case, the sensor head of the first magnetic sensor may protrude from the bobbin or cover member toward one side in the axial direction, and the sensor head of the second magnetic sensor may protrude from the bobbin or cover member toward the other side in the axial direction. This makes it possible to bring an object to be measured close to the first magnetic sensor.

Advantageous Effects of the Invention

According to the present invention, it is possible to facilitate a change in the number and layout of the magnetic field detection devices to be arranged in an array.

MODE FOR CARRYING OUT THE INVENTION

Hereinafter, preferred embodiments of the present invention will be described in detail with reference to the accompanying drawings.

Figure 1:
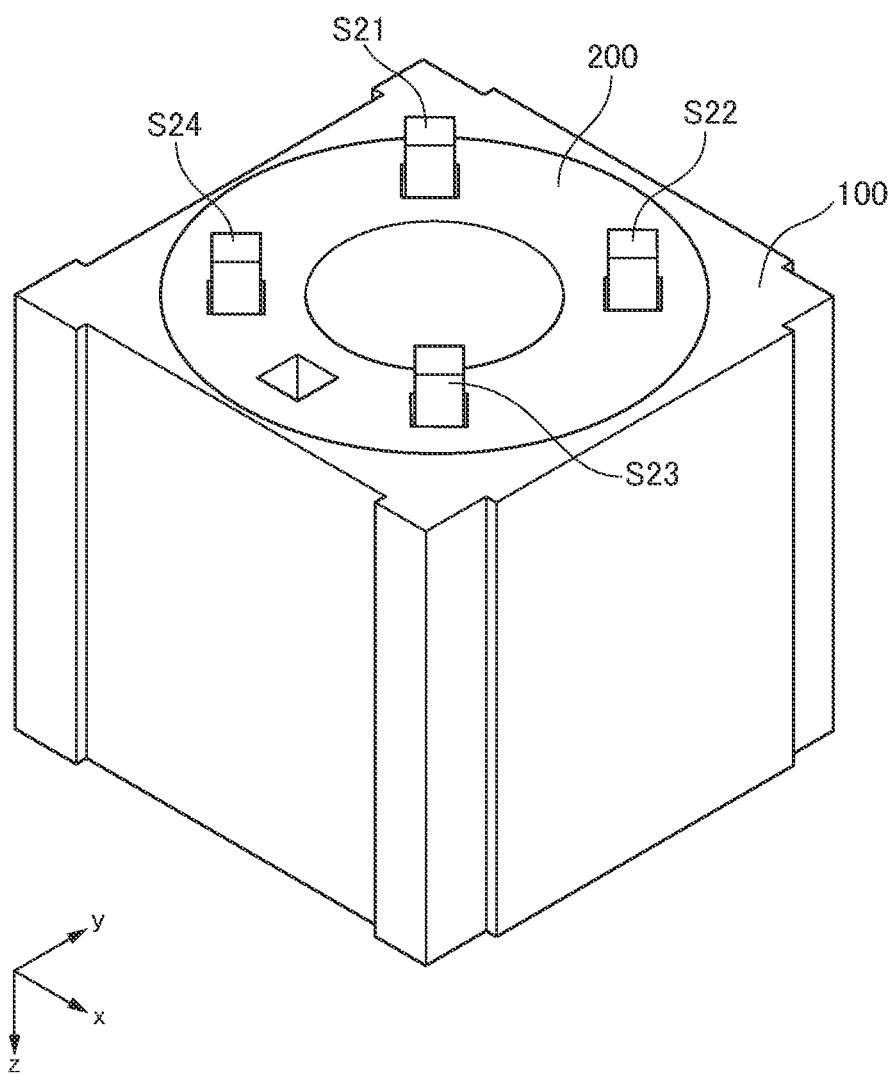
FIG. 1 is a schematic perspective view illustrating the outer appearance of a magnetic field detection device 1 according to a first embodiment of the present invention.

FIG. 1 is a schematic perspective view illustrating the outer appearance of a magnetic field detection device 1 according to a first embodiment of the present invention.

Figure 2:
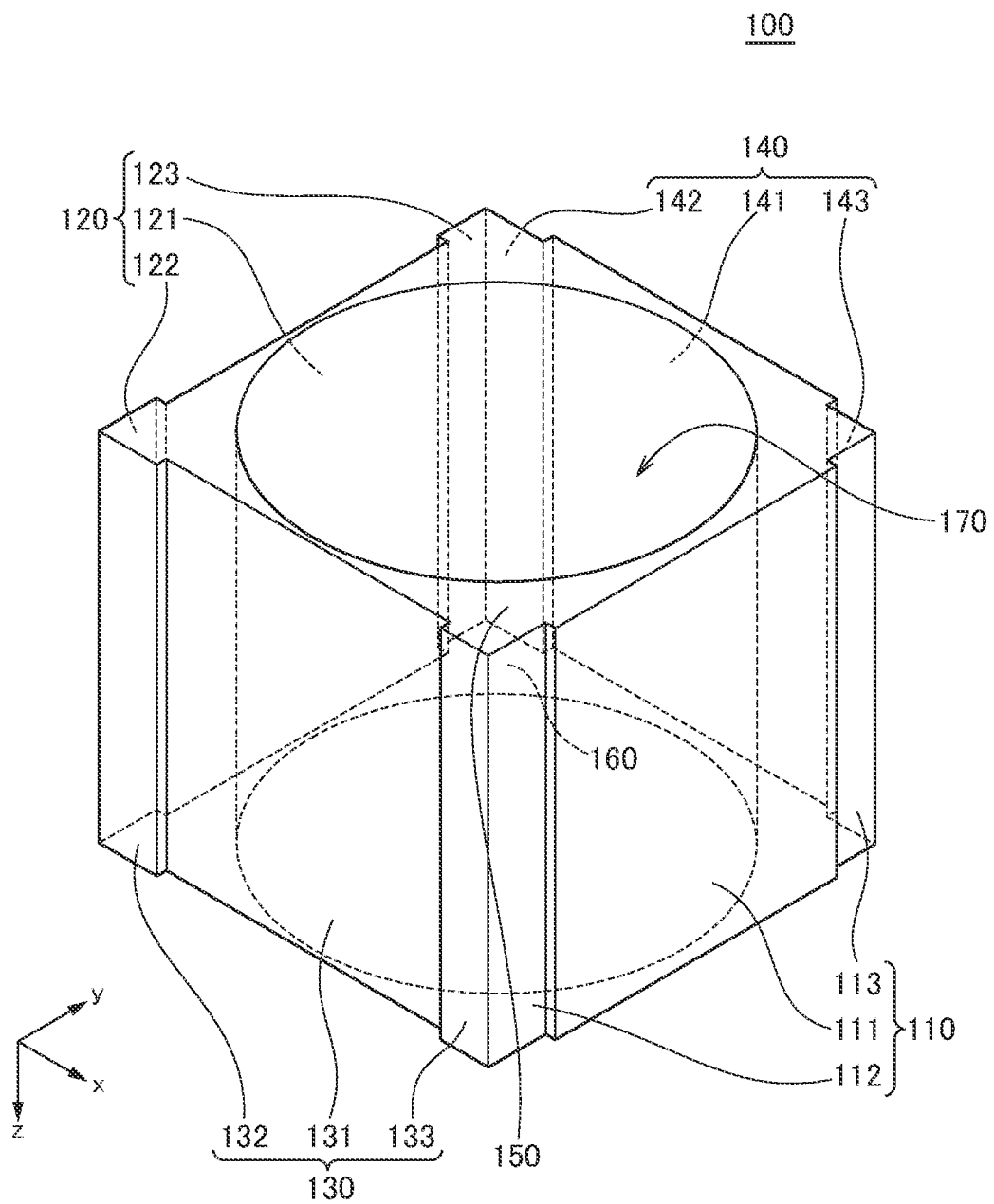
FIG. 2 is a schematic perspective view illustrating the outer appearance of a cover member 100.

As illustrated in FIG. 1, the magnetic field detection device 1 according to the first embodiment is constituted of a cover member 100 and a main body part 200 housed in the cover member 100. As illustrated in FIG. 2, the cover member 100 has four side surfaces 110, 120, 130, and 140, an upper surface 150, and a lower surface 160, and a housing part 170 is formed so as to penetrate the cover member 100 in the z-direction from the upper surface 150 to the lower surface 160. The main body part 200 is housed in the housing part 170 formed in the cover member 100. The side surfaces 110 and 120 of the cover member 100 constitute the yz plane and positioned on mutually opposite sides. The side surfaces 130 and 140 of the cover member 100 constitute the xz plane and positioned on mutually opposite sides. The upper and lower surfaces 150 and 160 of the cover member 100 constitute the xy plane and positioned on mutually opposite sides. The side surfaces 110, 120 and the side surfaces 130, 140 are perpendicular to each other. The width of each of the side surfaces 110 and 120 in the y-direction is the same as the width of each of the side surfaces 130 and 140 in the x-direction. That is, the outer shape of the cover member 100 is substantially square as viewed in the z-direction.

The side surface 110 has a first part 111, a second part 112, and a third part 113. The first part 111 is sandwiched between the second and third parts 112 and 113 in the y-direction and protrudes in the x-direction from the second and third parts 112 and 113. A step formed by the first and second parts 111 and 112 and a step formed by the first and third parts 111 and 113 both extend in the z-direction and constitute an engagement portion of the side surface 110.

The side surface 120 has a first part 121, a second part 122, and a third part 123. The first part 121 is sandwiched between the second and third parts 122 and 123 in the y-direction and is recessed in the x-direction from the second and third parts 122 and 123. A step formed by the first and second parts 121 and 122 and a step formed by the first and third parts 121 and 123 both extend in the z-direction and constitute an engagement portion of the side surface 120. The engagement portion of the side surface 120 has a shape engageable with the engagement portion of the side surface 110. That is, the width of the first part 121 of the side surface 120 in the y-direction is designed to be substantially equal to or slightly larger than the width of the first part 111 of the side surface 110 in the y-direction.

The side surface 130 has a first part 131, a second part 132, and a third part 133. The first part 131 is sandwiched between the second and third parts 132 and 133 in the x-direction and is recessed in the y-direction from the second and third parts 132 and 133. A step formed by the first and second parts 131 and 132 and a step formed by the first and third parts 131 and 133 both extend in the z-direction and constitute an engagement portion of the side surface 130.

The side surface 140 has a first part 141, a second part 142, and a third part 143. The first part 141 is sandwiched between the second and third parts 142 and 143 in the x-direction and protrudes in the y-direction from the second and third parts 142 and 143. A step formed by the first and second parts 141 and 142 and a step formed by the first and third parts 141 and 143 both extend in the z-direction and constitute an engagement portion of the side surface 140. The engagement portion of the side surface 140 has a shape engageable with the engagement portion of the side surface 130. That is, the width of the first part 141 of the side surface 140 in the x-direction is designed to be substantially equal to or slightly smaller than the width of the first part 131 of the side surface 130 in the x-direction.

Figure 3:
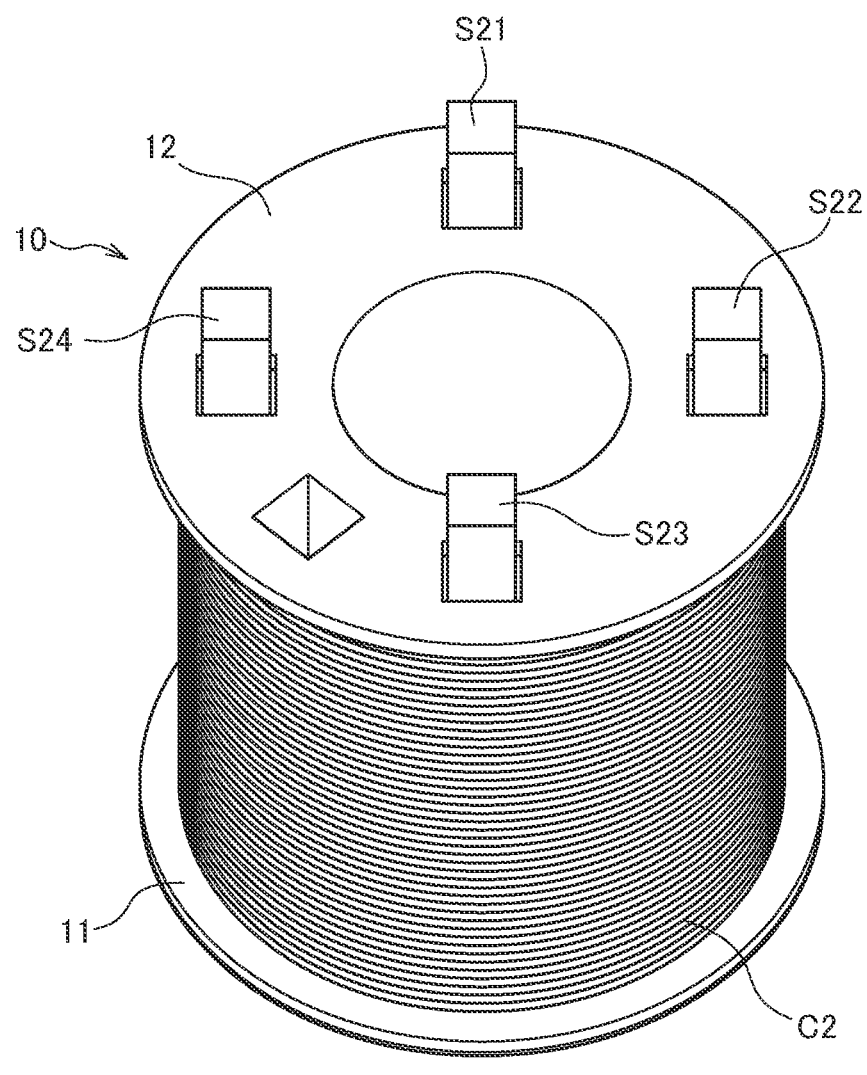
FIG. 3 is a schematic perspective view illustrating a main body part 200 as viewed from a measurement surface side.
Figure 4:
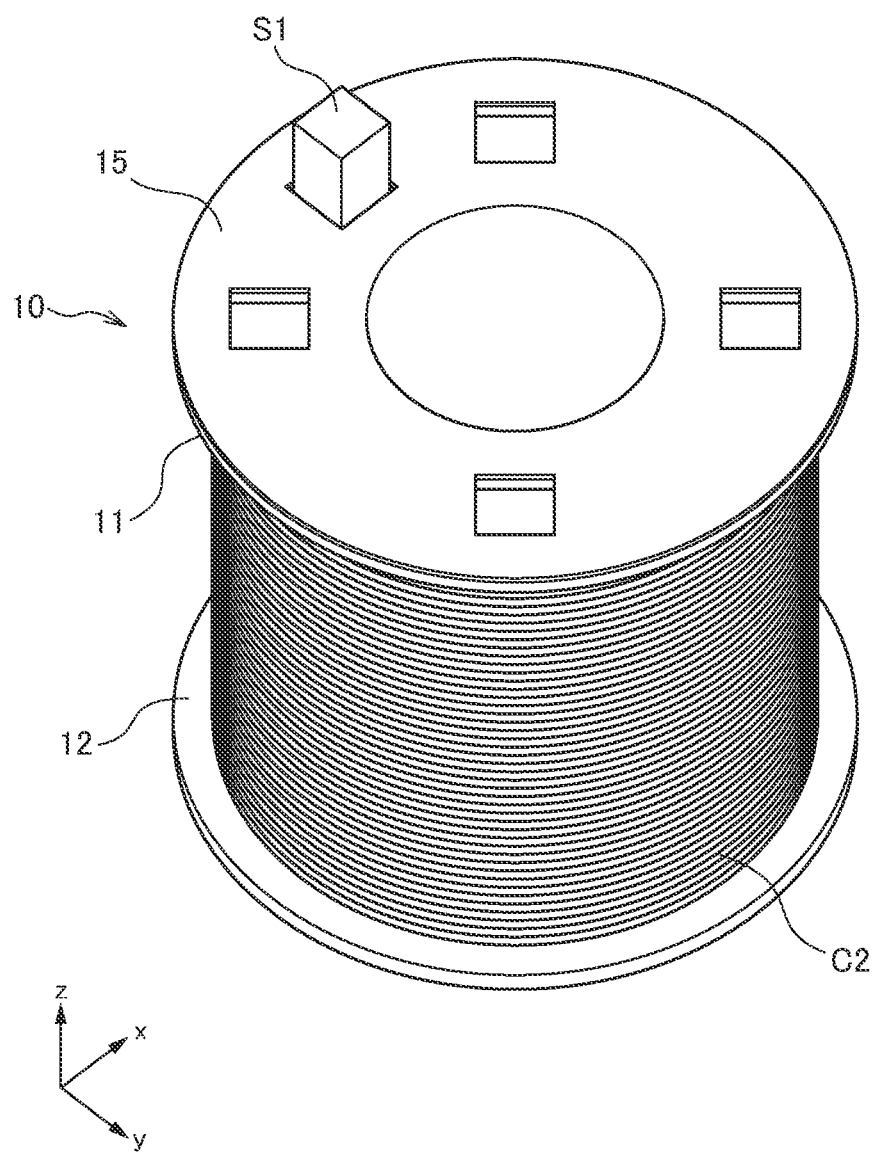
FIG. 4 is a schematic perspective view illustrating the main body part 200 as viewed from a back surface side.

FIGS. 3 and 4 are views illustrating the outer appearance of the main body part 200. FIG. 3 is a schematic perspective view as viewed from a measurement surface side, and FIG. 4 is a schematic perspective view as viewed from a back surface side.

Figure 5:
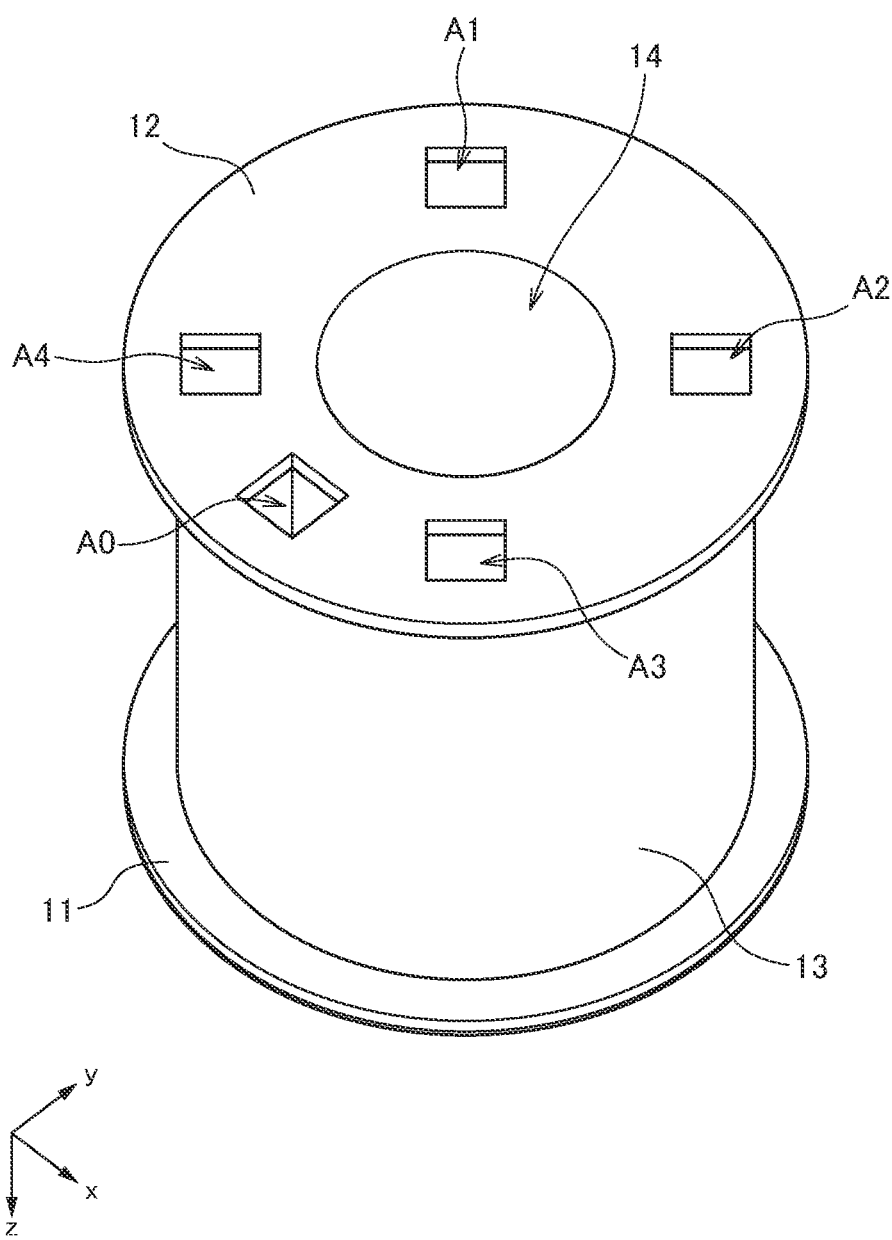
FIG. 5 is a schematic perspective view illustrating the outer appearance of a bobbin 10.

As illustrated in FIGS. 3 and 4, the main body part 200 includes a bobbin 10 made of a resin material, a cancel coil C2 wound around the bobbin 10, and a plurality of magnetic sensors S1 and S21 to S24 fixed to the bobbin 10. The bobbin 10 is housed in the housing part 170 of the cover member 100 and fixed therein. As a result, the cancel coil C2 is covered and protected with the cover member 100 in a direction (radial direction) perpendicular to the axial direction thereof. As illustrated in FIG. 5, the bobbin 10 includes a winding core part 13 and flange parts 11 and 12 provided at both ends of the winding core part 13 in the z-direction. The outer peripheral surface of the winding core part 13 has a circular shape as viewed in the z-direction. The cancel coil C2 is wound around the winding core part 13 of the bobbin 10, and thus the axial direction of the cancel coil C2 is the z-direction. The winding core part 13 is formed into a tubular shape and has a hollow part 14 extending in the z-direction. The outer peripheral surface of the winding core part 13 may not necessarily have a circular shape and may be a quadrangular shape, an octagonal shape, or an elliptic shape.

In the present embodiment, five cavities A0 to A4 are formed in the winding core part 13 of the bobbin 10. The cavities A0 to A4 are through holes penetrating the winding core part 13 in the z-direction. One end of each of the cavities A0 to A4 in the z-direction is opened at the surface of the flange part 11, and the other end thereof in the z-direction is opened at the surface of the flange part 12. The radial direction positions of the respective cavities A0 to A4 are the same. In the present embodiment, the magnetic sensor S1 is installed in the cavity A0, and the magnetic sensors S21 to S24 are installed in the cavities A1 to A4, respectively. A sensor head of the magnetic sensor S1 protrudes in the z-direction from the flange part 11, and sensor heads of the respective magnetic sensors S21 to S24 protrude in the z-direction from the flange part 12. The magnetic sensors S1 and S21 to S24 are connected to a circuit board 15 fixed to the flange part 11 of the bobbin 10.

With the above configuration, the magnetic sensors S1 and S21 to S24 are each disposed at a position overlapping the inner diameter area of the cancel coil C2 as viewed in the z-direction. Further, the position of the sensor head of the magnetic sensor S1 in the z-direction and the positions of the sensor heads of the respective magnetic sensors S21 to S24 in the z-direction differ from each other. The positions of the sensor heads of the respective magnetic sensors S21 to S24 in the z-direction are the same. Further, the radial direction positions of the sensor heads centering around the coil axis are the same among the magnetic sensors S1 and S21 to S24.

The magnetic sensor S1 is a sensor for detecting an environmental magnetic field component such as terrestrial magnetism, while the magnetic sensors S21 to S24 are sensors for detecting a signal magnetic field component emitted from an object to be measured. The sensitivity axis directions of the magnetic sensors S1 and S21 to S24 are all along the z-direction. Although the major part of each of the magnetic sensors S1 and S21 to S24 are positioned in the inner diameter area of the cancel coil C2, the sensor heads of the respective magnetic sensors S21 to S24 protrude from the flange part 12, as described above. Due to this structure, the sensor heads of the magnetic sensors S21 to S24 come closer to an object to be measured. That is, when the sensor heads of the magnetic sensors S21 to S24 are embedded in the bobbin 10, the distance between an object to be measured and the magnetic sensors S21 to S24 becomes large. On the other hand, the sensor head of the magnetic sensor S1 need not protrude from the flange part 11; however, to enhance the symmetry with the magnetic sensors S21 to S24, the magnetic sensor S1 preferably protrudes from the flange part 11 by the amount equal to the protruding amount of the magnetic sensors S21 to S24 from the flange part 12.

Figure 6:
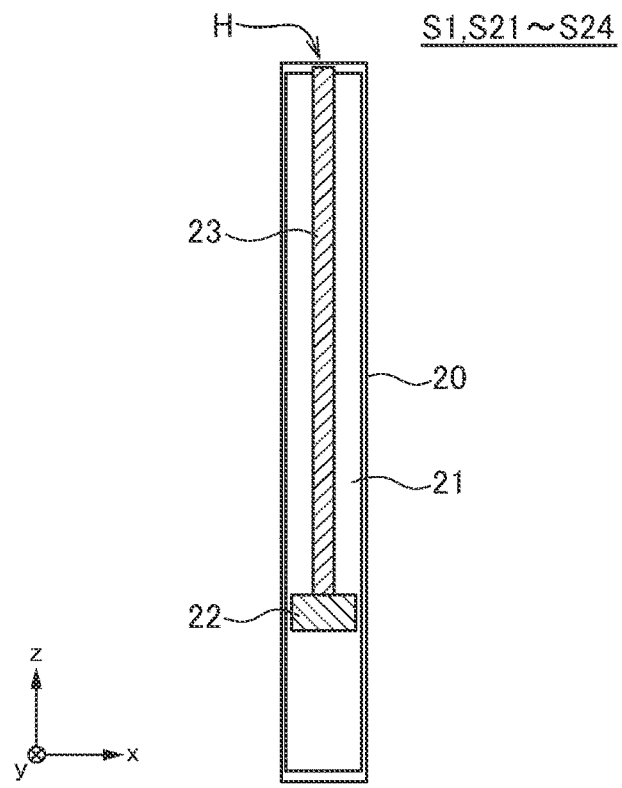
FIG. 6 is a schematic view illustrating an example of the internal structure of the magnetic sensors S1 and S21 to S24.

FIG. 6 is a schematic view illustrating an example of the internal structure of the magnetic sensors S1 and S21 to S24.

In the example illustrated in FIG. 6, the magnetic sensors S1 and S21 to S24 have the same structure and each include a sensor housing body 20, a substrate 21 housed in the sensor housing body 20, a sensor chip 22, and a magnetism collector 23. The sensor chip 22 and magnetism collector 23 are mounted on the substrate 21. The magnetism collector 23 has a rod-like shape extending in the z-direction and is made of a high permeability material such as ferrite. One end of the magnetism collector 23 in the z-direction constitutes a sensor head H, and the sensor chip 22 is disposed at the other end of the magnetism collector 23 in the z-direction. With this configuration, the signal magnetic field component in the z-direction emitted from an object to be measured positioned in the vicinity of the sensor head H is collected by the magnetism collector 23 so as to be applied to the sensor chip 22.

Figure 7:
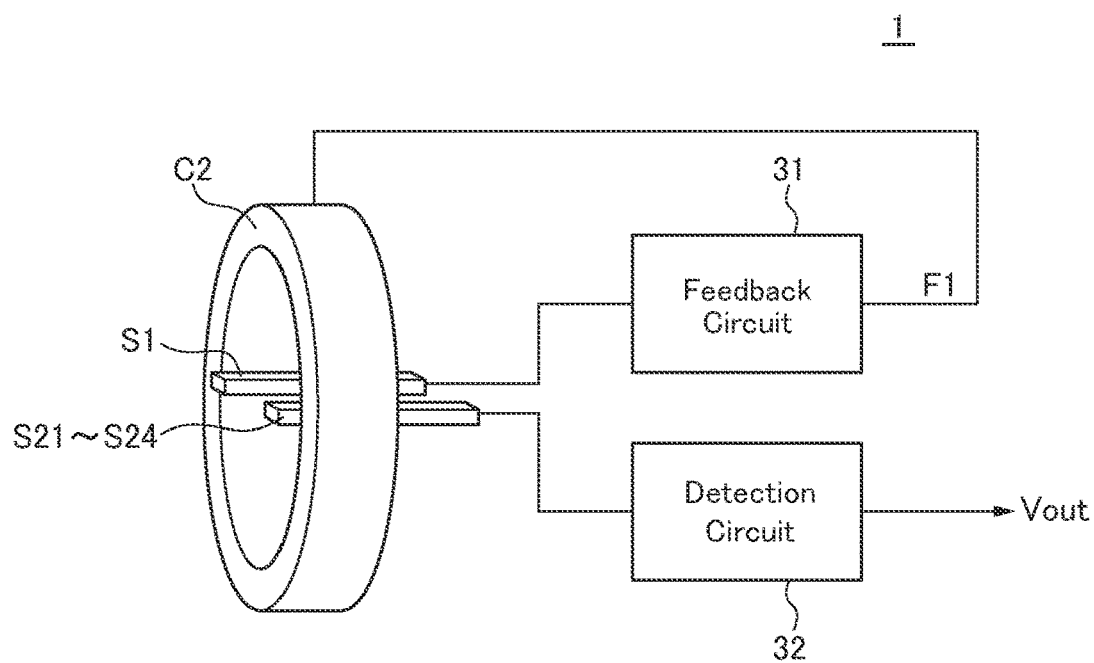
FIG. 7 is a block diagram illustrating the circuit configuration of the main body part 200.

FIG. 7 is a block diagram illustrating the circuit configuration of the main body part 200.

As illustrated in FIG. 7, the main body part 200 includes a feedback circuit 31 connected to the magnetic sensor S1 and a detection circuit 32 connected to the magnetic sensors S21 to S24. The feedback circuit 31 is a circuit generating a feedback current F1 for canceling the signal magnetic field component, and the feedback current F1 generated by the feedback circuit 31 is supplied to the cancel coil C2. As a result, the magnetic sensor S1, feedback circuit 31, and cancel coil C2 constitute a feedback loop for canceling the environmental magnetic field component. On the other hand, the detection circuit 32 generates, according to output signals from the magnetic sensors S21 to S24, a detection signal Vout indicating the signal magnetic field component emitted from an object to be measured.

Figure 8:
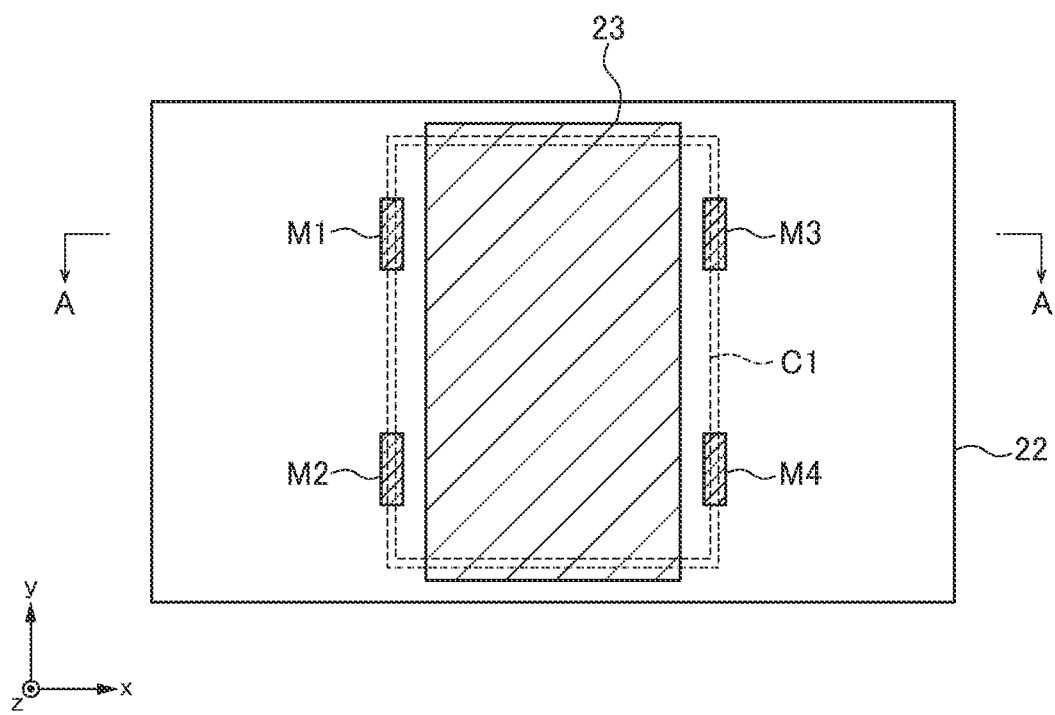
FIG. 8 is a schematic plan view of the sensor chip 22.
Figure 9:
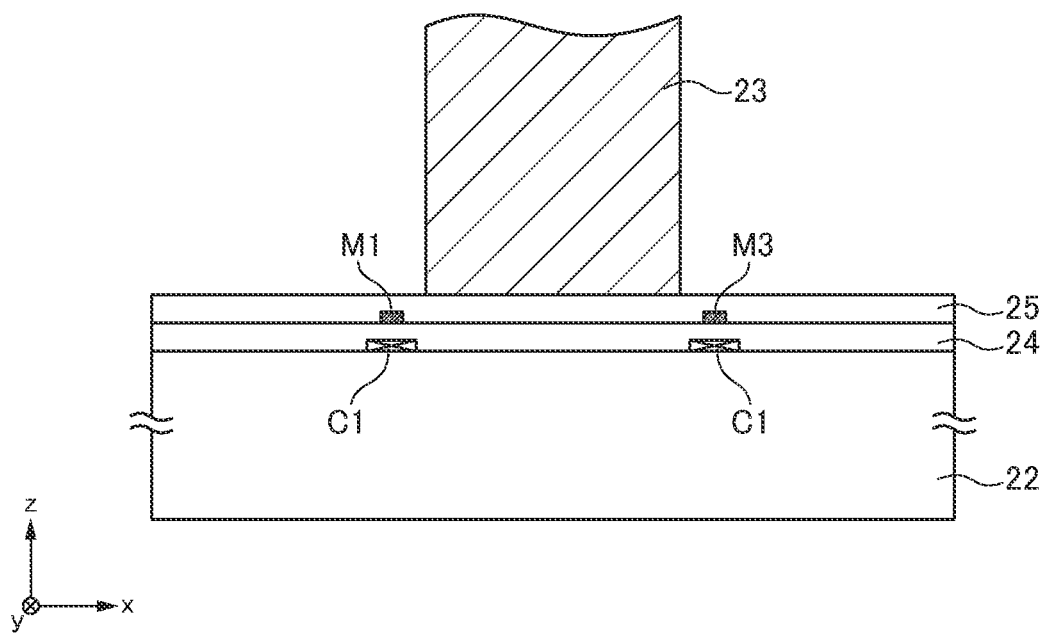
FIG. 9 is a schematic cross-sectional view taken along the line A-A in FIG. 8.

FIG. 8 is a schematic plan view of the sensor chip 22, and FIG. 9 is a schematic cross-sectional view taken along the line A-A in FIG. 8.

As illustrated in FIGS. 8 and 9, the sensor chip 22 has, on its element formation surface, four magnetoresistance effect elements M1 to M4 and a cancel coil C1. The cancel coil C1 is covered with an insulating film 24, and the magnetoresistance effect elements M1 to M4 are formed on the insulating film 24. The magnetoresistance effect elements M1 to M4 are covered with an insulating film 25. The magnetism collector 23 is disposed between the magnetoresistance effect elements M1, M2 and the magnetoresistance effect elements M3, M4 as viewed in the z-direction. With this configuration, a magnetic field in the z-direction collected by the magnetism collector 23 is distributed in the positive x-direction and the negative x-direction on the element formation surface of the sensor chip 22. As a result, magnetic field components in mutually opposite directions are applied to the magnetoresistance effect elements M1, M2 and magnetoresistance effect elements M3, M4. The fixed magnetization directions of the magnetoresistance effect elements M1 to M4 are made uniform in the positive x-direction or negative x-direction.

The cancel coil C1 is disposed so as to overlap the magnetoresistance effect elements M1 to M4. When a cancel current is made to flow in the cancel coil C1, cancel magnetic fields in mutually opposite directions are applied to the magnetoresistance effect elements M1, M2 and magnetoresistance effect elements M3, M4.

Figure 10:
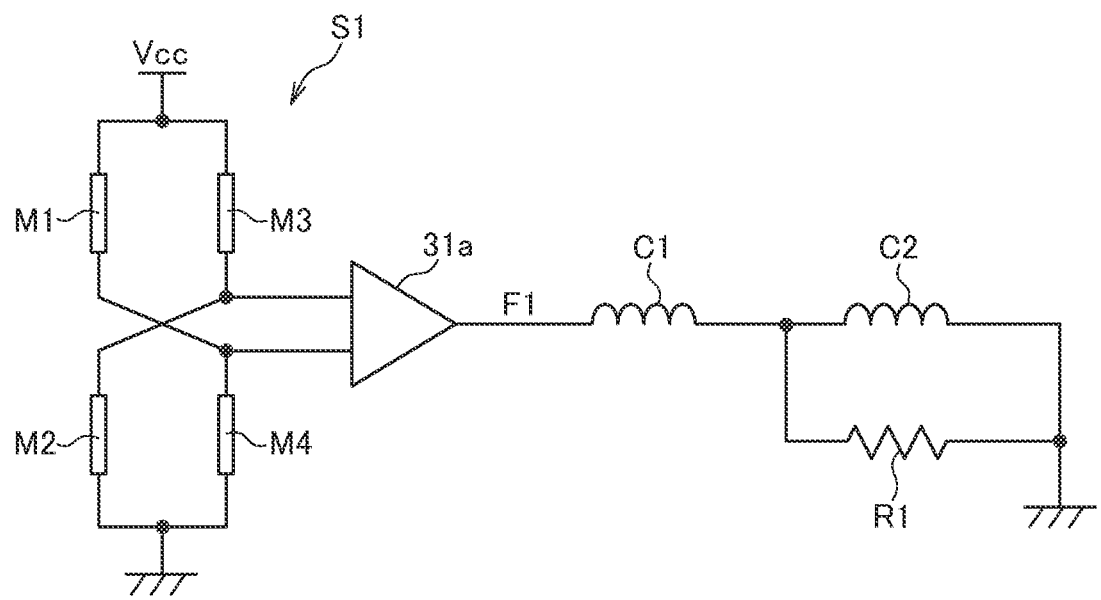
FIG. 10 is a circuit diagram of the feedback loop constituted by the magnetic sensor S1, feedback circuit 31, and cancel coil C2.

FIG. 10 is a circuit diagram of the feedback loop constituted by the magnetic sensor S1, feedback circuit 31, and cancel coil C2.

As illustrated in FIG. 10, the magnetoresistance effect elements M1 to M4 included in the magnetic sensor S1 are bridge-connected, and a differential signal generated thereby is supplied to a differential amplifier 31a included in the feedback circuit 31. The differential amplifier 31a generates the feedback current F1 based on the supplied differential signal. The feedback current F1 flows in the series-connected cancel coils C1 and C2. This causes the cancel coils C1 and C2 to generate a cancel magnetic field so as to make a differential signal component which is an output signal of the magnetic sensor S1 zero.

In the present embodiment, a resistor R1 is connected in parallel to the cancel coil C2. The resistance value of the resistor R1 is larger than the equivalent series resistance (ESR) of the cancel coil C2 and is preferably set to 10 times or more, and more preferably, 100 times or more the ESR of the cancel coil C2. Thus, of the feedback current F1, a lower frequency component due to terrestrial magnetism flows in the cancel coil C2, while a high frequency component that is a cause of oscillation is detoured to the resistor R1. This makes it possible to properly cancel the environmental magnetic field component such as terrestrial magnetism while preventing oscillation of the feedback loop.

Figure 11:
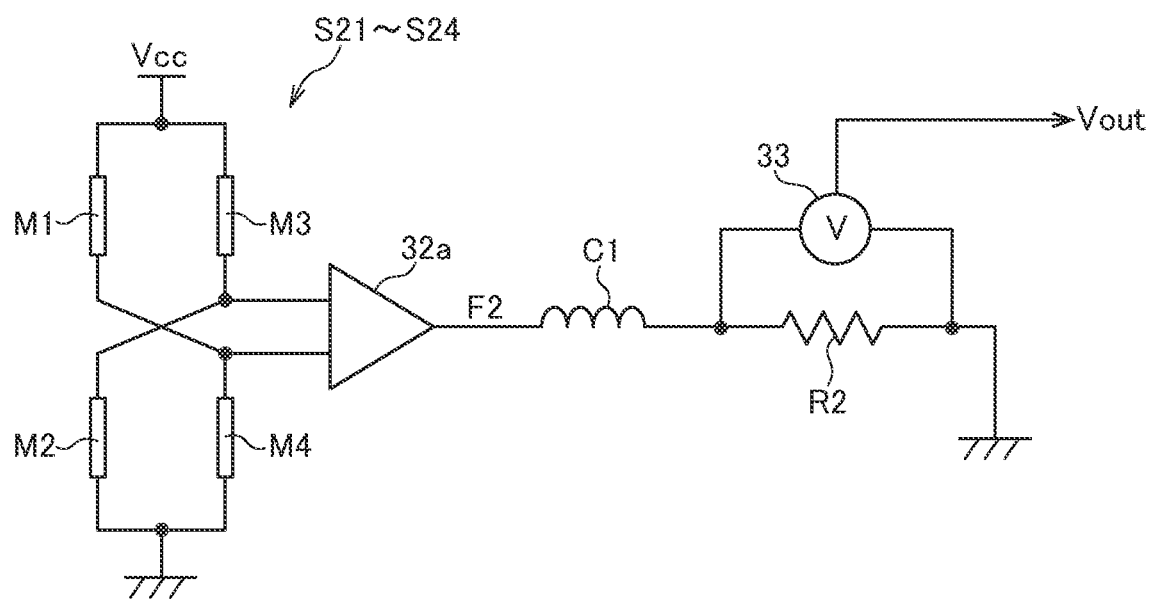
FIG. 11 is a circuit diagram of a circuit constituted by the magnetic sensors S21 to S24 and detection circuit 32.

FIG. 11 is a circuit diagram of a circuit constituted by the magnetic sensors S21 to S24 and detection circuit 32.

As illustrated in FIG. 9, the magnetoresistance effect elements M1 to M4 included in each of the magnetic sensors S21 to S24 are bridge-connected, and a differential signal generated thereby is supplied to a differential amplifier 32a included in the detection circuit 32. The differential amplifier 32a generates a feedback current F2 based on the differentia signal. The feedback current F2 flows in the cancel coil C1. This causes the cancel coil C1 to generate a cancel magnetic field so as to make a differential signal component as output signals of the magnetic sensors S21 to S24 zero.

Further, the detection circuit 32 has a resistor R2 that current-voltage converts the feedback current F2 and a voltage measurement circuit 33 that measures a voltage across the resistor R2. Thus, when the feedback current F2 flows, a detection signal Vout proportional to the amount of the flowing current is generated.

Figure 12:
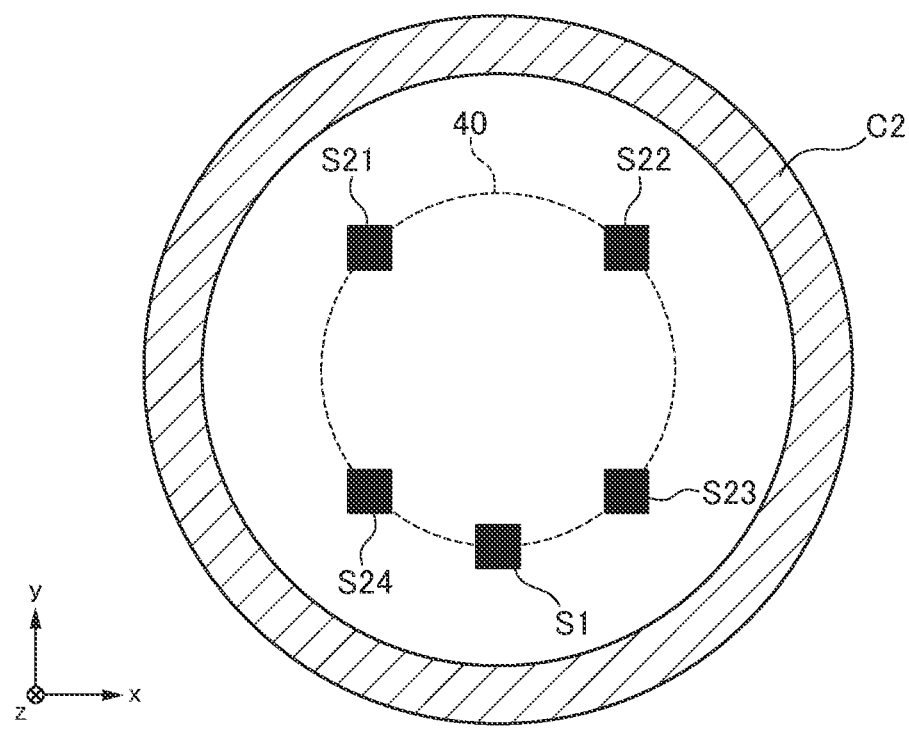
FIG. 12 is a schematic view for explaining the positions of the magnetic sensors S1 and S21 to S24 in the radial direction.

FIG. 12 is a schematic view for explaining the positions of the magnetic sensors S1 and S21 to S24 in the radial direction.

As illustrated in FIG. 12, as viewed in the axial direction (z-direction) of the cancel coil C2, the magnetic sensor S1 is disposed at a position offset from the center of the inner diameter area of the cancel coil C2. As described above, the cancel coil C2 generates a cancel magnetic field so as to make the environmental magnetic field component to be applied to the magnetic sensor S1 zero. However, the environmental magnetic field component becomes zero not only at the position where the magnetic sensor S1 is disposed but also in a cancel space 40 distributed concentrically with the cancel coil C2. This is because that the intensity distribution of the cancel magnetic field spreads concentrically, so that when the environmental magnetic field component is uniform, it is completely cancelled in the area lying in the same radial position as the magnetic sensor S1.

Figure 13:
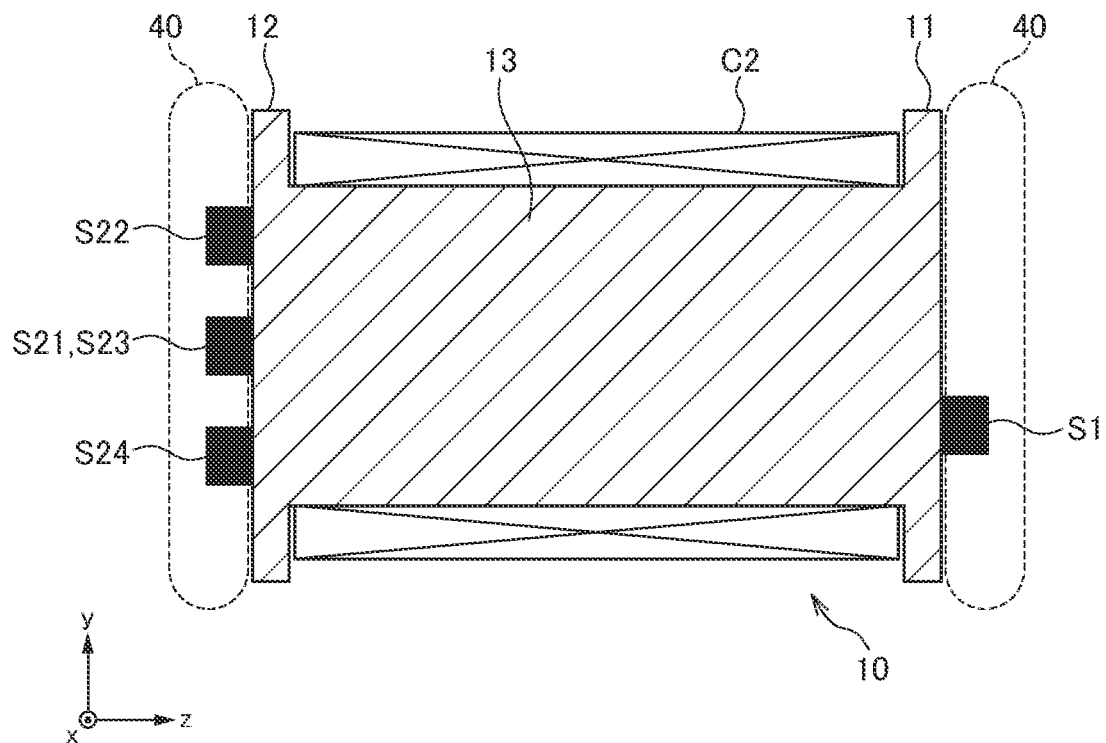
FIG. 13 is a schematic view for explaining the position of a cancel space 40.

As illustrated in FIG. 13, the cancel space 40 is present on the flange part 11 side where the sensor head of the magnetic sensor S1 is positioned and symmetrically on the flange part 12 side where the sensor heads of the magnetic sensors S21 to S24 are positioned. In the present embodiment, the magnetic sensors S21 to S24 are disposed in the cancel space 40 on the flange part 12 side. Thus, the environmental magnetic field component to be applied to the magnetic sensors S21 to S24 also becomes zero, with the result that only the signal magnetic field component emitted from an object to be measured is applied to the magnetic sensors S21 to S24. This makes it possible to detect even a weak magnetic field without using a shield room. In addition, the cancel coil C2 is assigned in common to the five magnetic sensors S1 and S21 to S24, so that it is possible to reduce the number of components and to simplify the circuit configuration.

In the present embodiment, the cavities A0 to A4 are disposed at the same radial position, so that the environmental magnetic field component to be applied to the magnetic sensors S21 to S24 becomes zero. In addition, in the present embodiment, the sensor head of the magnetic sensor S1 for detecting the environmental magnetic field component is provided on the flange part 11 side, and the sensor heads of the respective magnetic sensors S21 to S24 for detecting the signal magnetic field component are provided on the flange part 12 side, so that the signal magnetic field component emitted from an object to be measured is hardly applied to the magnetic sensor S1. This prevents a part or all of the signal magnetic field components from being cancelled. Thus, when measurement is performed with an object to be measured that generates a weak magnetic field brought close to the sensor heads of the magnetic sensors S21 to S24, the signal magnetic field component emitted from the object to be measured can be detected in real time. Further, since the cancel coil C2 and magnetic sensors S1 and S21 to S24 are fixed to the same bobbin 10, displacement between the cancel coil C2 and the magnetic sensors S1 and S21 to S24 hardly occurs.

Figure 14:
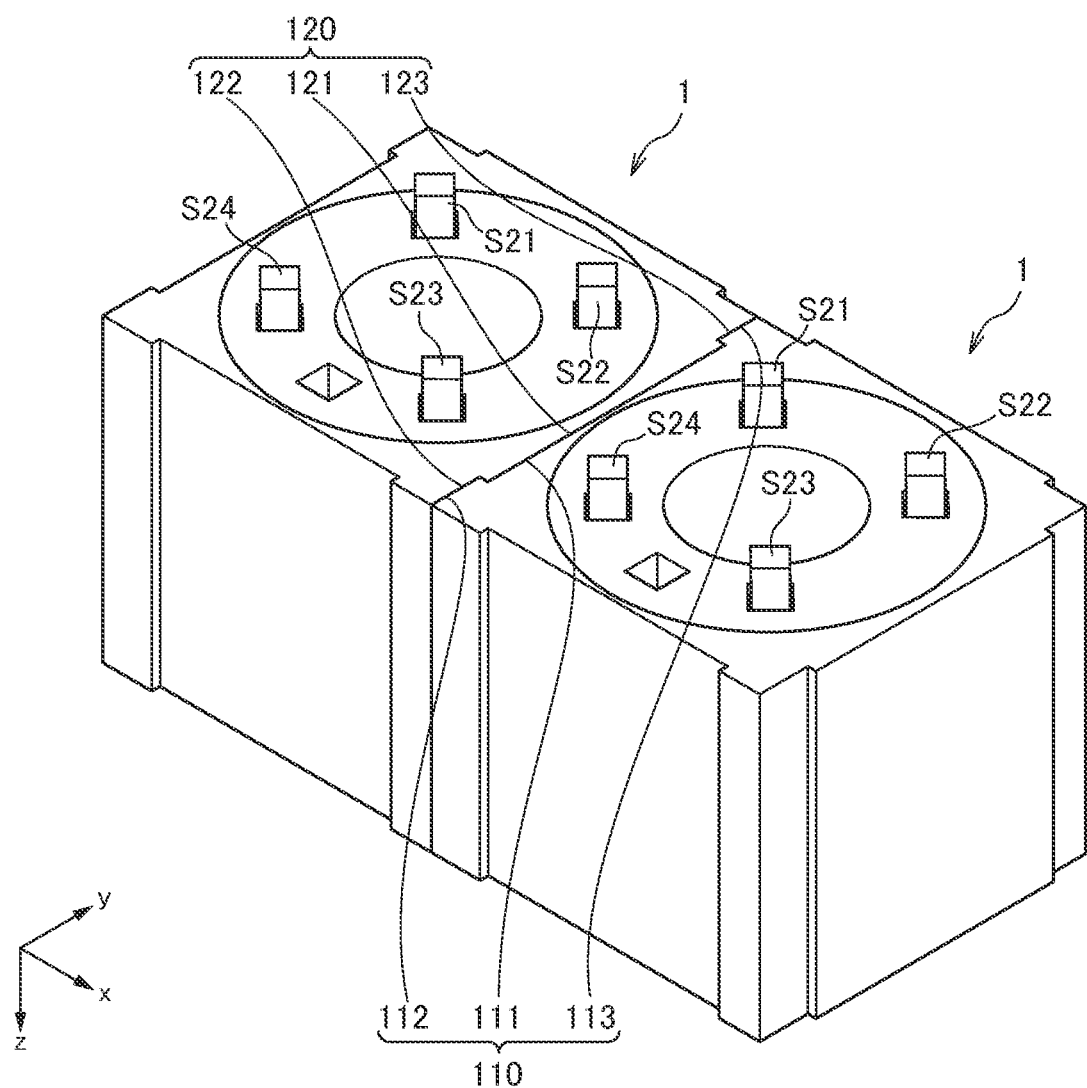
FIG. 14 is a schematic perspective view illustrating a magnetic field detection device array obtained by combining two magnetic field detection devices 1.

FIG. 14 is a schematic perspective view illustrating a magnetic field detection device array obtained by combining two magnetic field detection devices 1.

As illustrated in FIG. 14, when the two magnetic field detection devices 1 are connected in the x-direction, the side surface 110 of one magnetic field detection device 1 and the side surface 120 of the other magnetic field detection device 1 are made to face each other, and the engagement portions thereof are engaged. That is, the first to third parts 111 to 113 of the side surface 110 are respectively in close contact with the first to third parts 121 to 123 of the side surface 120, whereby the y-direction position of the two magnetic field detection devices 1 is fixed. Although not illustrated, when the two magnetic field detection devices 1 are connected in the y-direction, the side surface 130 of one magnetic field detection device 1 and the side surface 140 of the other magnetic field detection device 1 are made to face each other, and the engagement portions thereof are engaged, whereby the x-direction position of the two magnetic field detection devices 1 is fixed.

Figure 15:
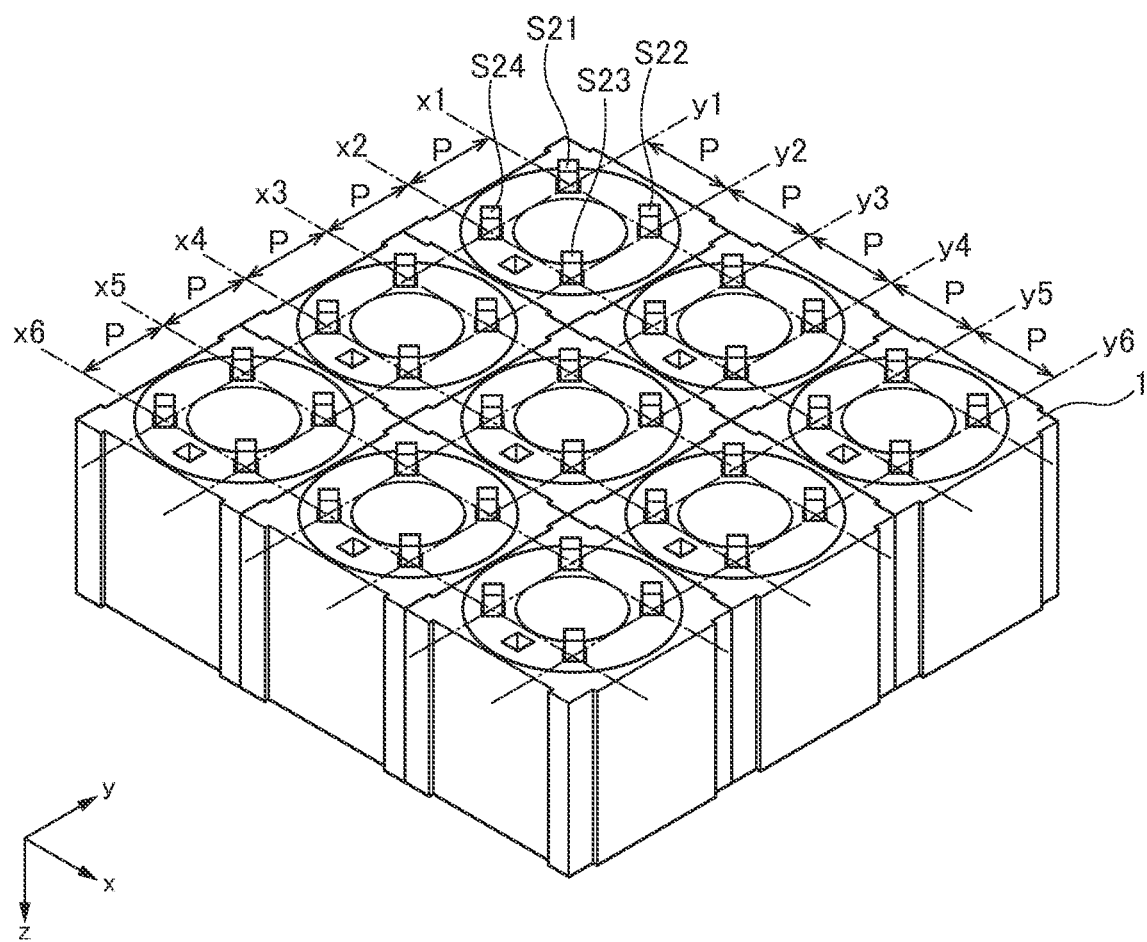
FIG. 15 is a schematic perspective view illustrating a magnetic field detection device array obtained by combining nine magnetic field detection devices 1.

FIG. 15 is a schematic perspective view illustrating a magnetic field detection device array obtained by combining nine magnetic field detection devices 1.

In the example illustrated in FIG. 15, nine magnetic field detection devices 1 are connected in a 3×3 array. In this case, the engagement portions formed respectively in the side surfaces 110 and 120 of the two magnetic field detection devices 1 adjacent to each other in the x-direction are engaged with each other, and the engagement portions formed respectively in the side surfaces 130 and 140 of the two magnetic field detection devices 1 adjacent to each other in the y-direction are engaged with each other.

When a plurality of the magnetic field detection devices 1 are arranged in an array in the above manner, the magnetic sensors S21 to S24 for detecting the signal magnetic field component can be arranged in a matrix in the xy plane. In the example illustrated in FIG. 15, the magnetic sensor S21, S22, S23 or S24 is disposed at each of the intersections between virtual lines x1 to x6 extending in the x-direction and virtual lines y1 to y6 extending in the y-direction. By designing a pitch P between the virtual lines x1 to x6 and a pitch P between the virtual lines y1 to y6 equal to each other, the spatial distribution of the signal magnetic field component can be measured over a wide range.

When a plurality of the magnetic field detection devices 1 are arranged in an array, the magnetic sensor S1 for detecting the environmental magnetic field component need not be provided in all the magnetic field detection devices 1, but it may be provided only in one of the magnetic field detection devices 1 and, in this case, the feedback current F1 may be supplied to the cancel coil C2 of each of the plurality of magnetic field detection devices 1. This can reduce the number of magnetic sensors to be used.

Figure 16:
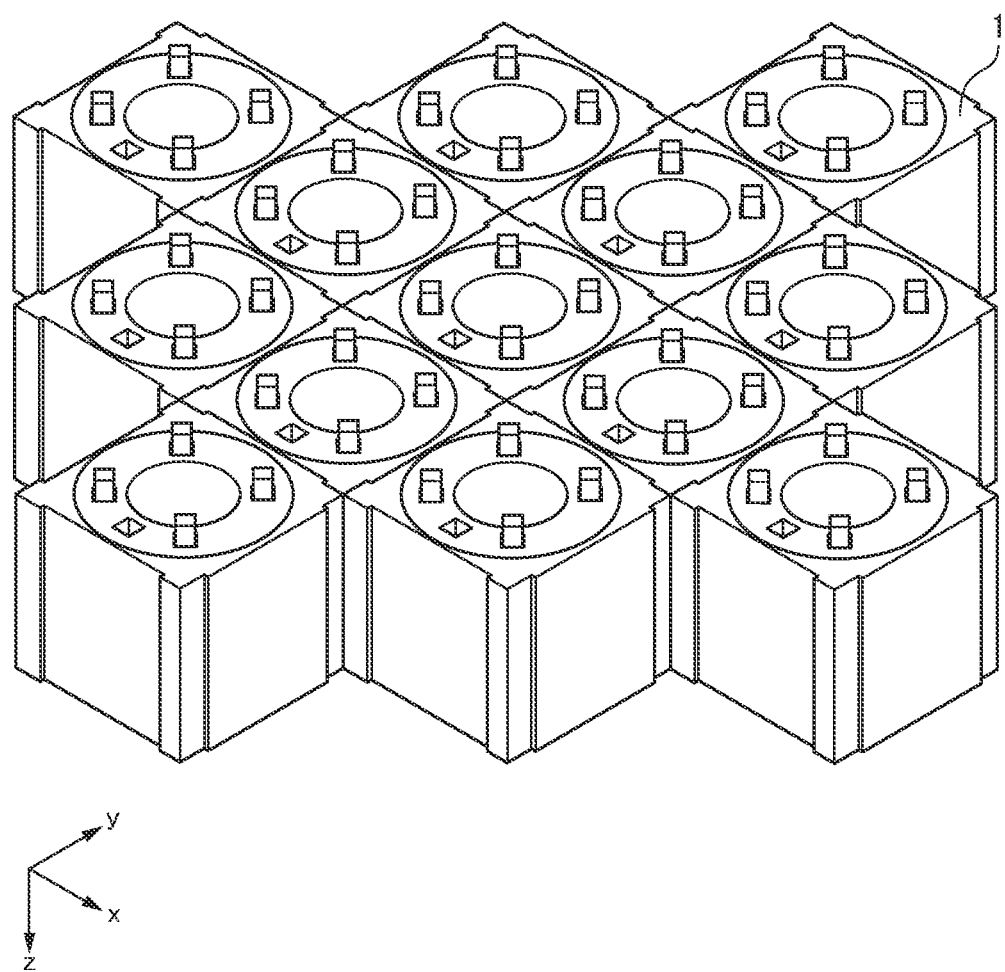
FIG. 16 is a schematic perspective view illustrating a magnetic field detection device array according to a first modification.
Figure 17:
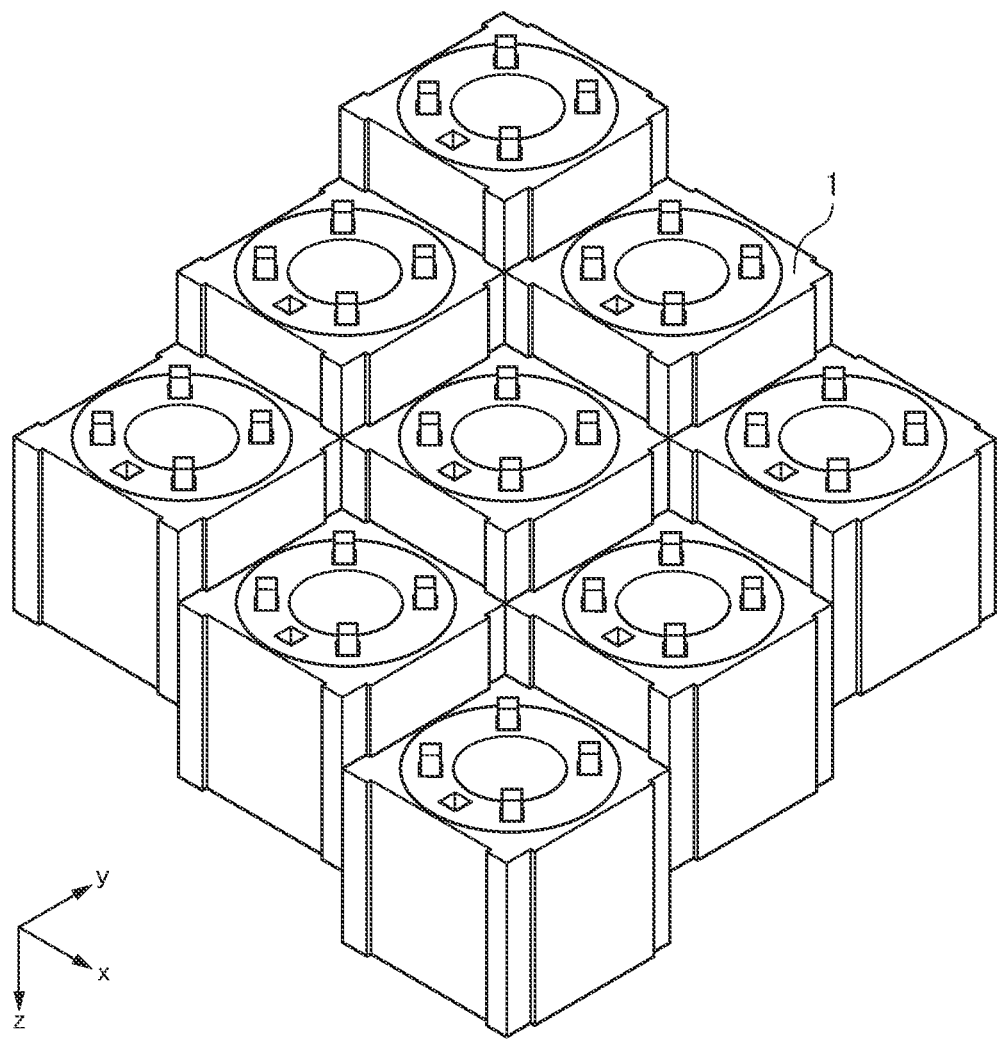
FIG. 17 is a schematic perspective view illustrating a magnetic field detection device array according to a second modification.
Figure 18:
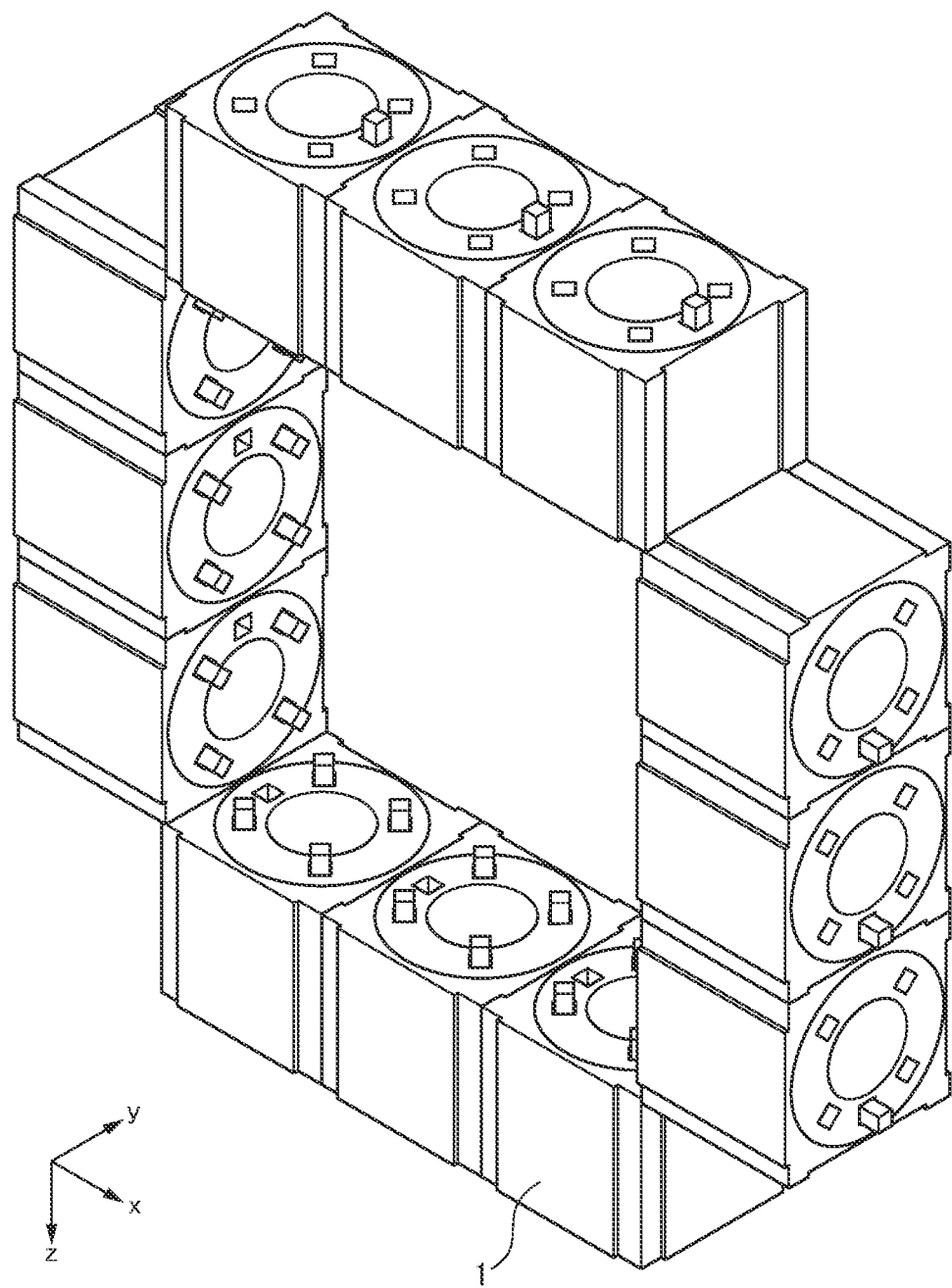
FIG. 18 is a schematic perspective view illustrating a magnetic field detection device array according to a third modification.
Figure 19:
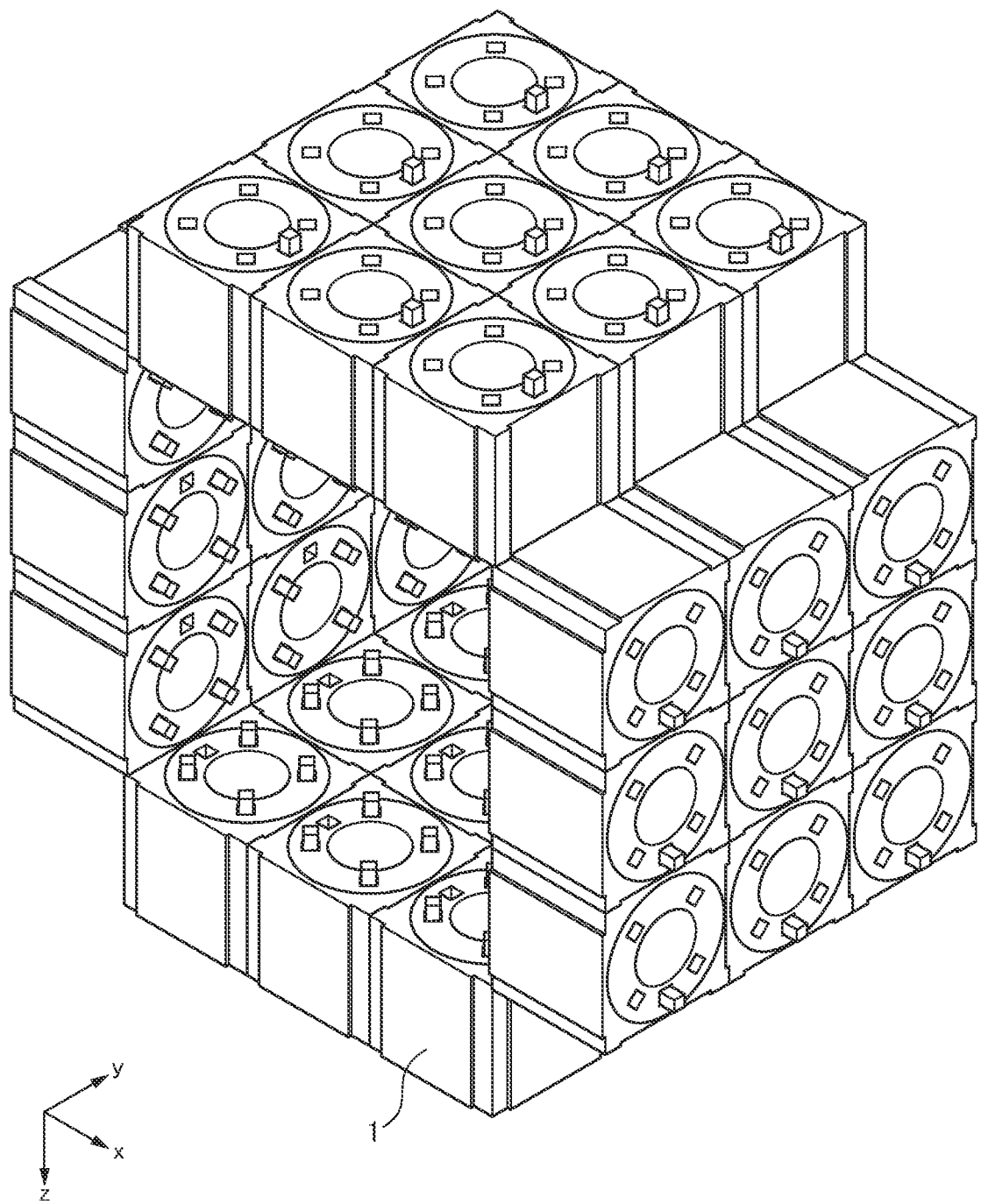
FIG. 19 is a schematic perspective view illustrating a magnetic field detection device array according to a fourth modification.

The plurality of magnetic field detection devices 1 can be desirably combined. For example, combination modes illustrated in FIGS. 16 to 19 are possible. FIG. 16 is an example in which the number of the magnetic field detection devices 1 differs depending on the position in the x-direction and the position in the y-direction. FIG. 17 is an example in which the position of the magnetic field detection device 1 in the z-direction differs depending on the position in the x-direction and the position in the y-direction. FIG. 18 is an example in which 12 magnetic field detection devices 1 are arranged in a ring shape, and FIG. 19 is an example in which three rings each including 12 magnetic field detection devices 1 are combined.

As described above, in the magnetic field detection device 1 according to the present embodiment, the side surfaces 110, 120, 130, and 140 of the cover member 100 housing the main body part 200 each have the engagement portion, so that it is possible to arrange a desired number of the magnetic field detection devices 1 in the respective x- and y-directions without displacement. This makes it possible to easily change the number and layout of the magnetic field detection devices 1.

Figure 20:
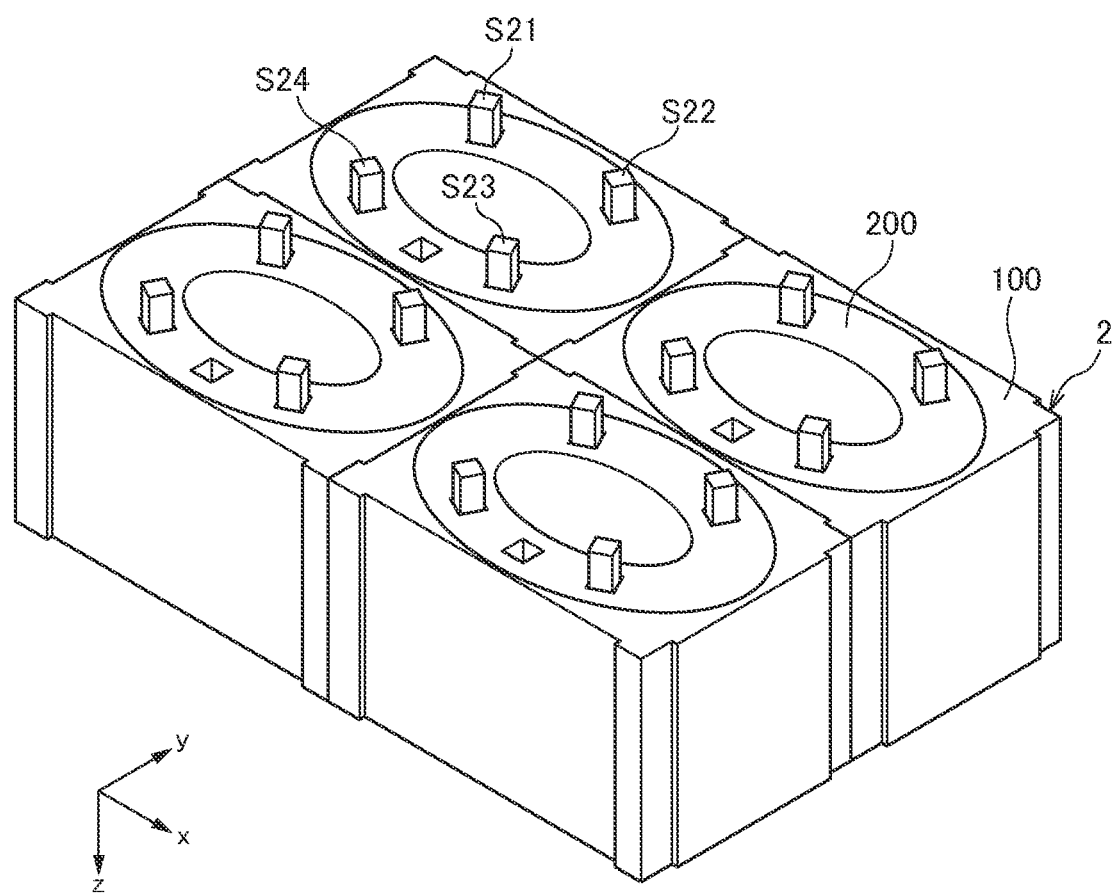
FIG. 20 is a schematic perspective view illustrating a magnetic field detection device array obtained by combining four magnetic field detection devices 2 according to a second embodiment of the present invention.

FIG. 20 is a schematic perspective view illustrating a magnetic field detection device array obtained by combining four magnetic field detection devices 2 according to a second embodiment of the present invention.

As illustrated in FIG. 20, the magnetic field detection device 2 according to the second embodiment differs from the magnetic field detection device 1 according to the first embodiment in that the width of the side surfaces 130 and 140 in the x-direction is larger than the width of the side surfaces 110 and 120 in the y-direction. That is, in the present embodiment, the cover member 100 has a substantially rectangular outer shape as viewed in the z-direction. As exemplified by the magnetic field detection device 2 according to the second embodiment, the outer shape of the cover member 100 as viewed in the z-direction is not limited to a square in the present invention.

Figure 21:
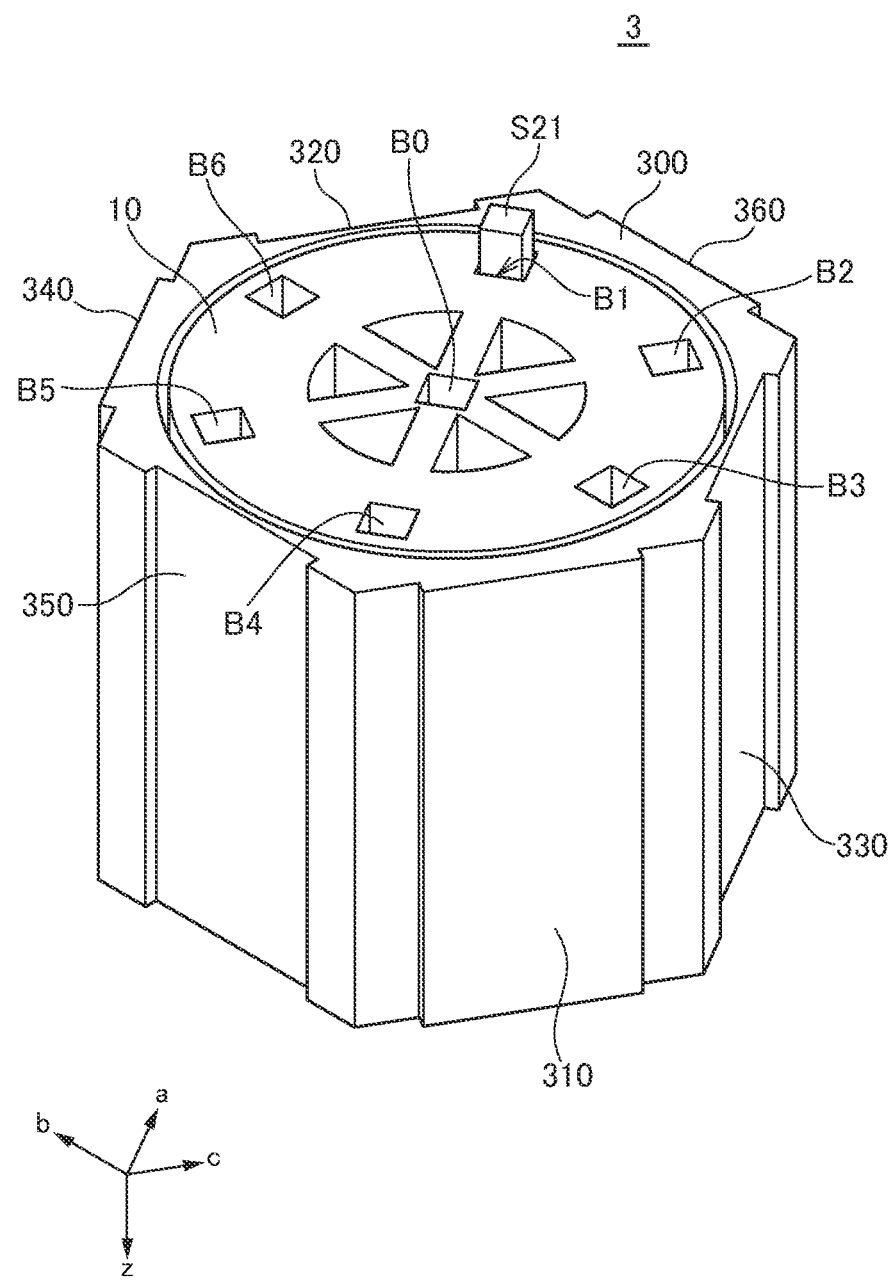
FIG. 21 is a schematic perspective view illustrating the outer shape of a magnetic field detection device 3 according to a third embodiment of the present invention.

FIG. 21 is a schematic perspective view illustrating the outer shape of a magnetic field detection device 3 according to a third embodiment of the present invention.

As illustrated in FIG. 21, the magnetic field detection device 3 according to the third embodiment differs from the magnetic field detection device 1 according to the first embodiment in that a cover member 300 has a hexagonal outer shape as viewed in the z-direction. In the present embodiment, the cover member 300 has six side surfaces 310, 320, 330, 340, 350, and 360. The side surfaces 310 and 320 are perpendicular to the direction a, the side surfaces 330 and 340 are perpendicular to the direction b, and the side surfaces 350 and 360 are perpendicular to the direction c. The directions a, b, and c form an angle of 60° or 120° with one another. Accordingly, the side surface 310 (320), side surface 330 (340), and side surface 350 (360) form 60° or 120° with one another.

Further, the engagement portion formed in the side surface 310 and the engagement portion formed in the side surface 320 positioned on the side opposite the side surface 310 have shapes engageable with each other, the engagement portion formed in the side surface 330 and the engagement portion formed in the side surface 340 positioned on the side opposite the side surface 330 have shapes engageable with each other, and the engagement portion formed in the side surface 350 and the engagement portion formed in the side surface 360 positioned on the side opposite the side surface 350 have shapes engageable with each other. In the example illustrated in FIG. 21, a cavity B0 is formed at the center portion of the bobbin 10, and six cavities B1 to B6 are concentrically formed around the cavity B0. The magnetic sensor S21 for detecting the signal magnetic field component is inserted into the cavity B1. The magnetic sensors S22 to S24 for detecting the signal magnetic field component or the magnetic sensor S1 for detecting the environmental magnetic field component may be inserted into the remaining cavities B2 to B6. When the magnetic sensor S1 is inserted into the cavity B0, it is necessary to adjust the gain of the feedback loop so as to completely cancel the environmental magnetic field component not at the position where the magnetic sensor S1 itself is provided but at the position where the magnetic sensor S21 is provided.

Figure 22:
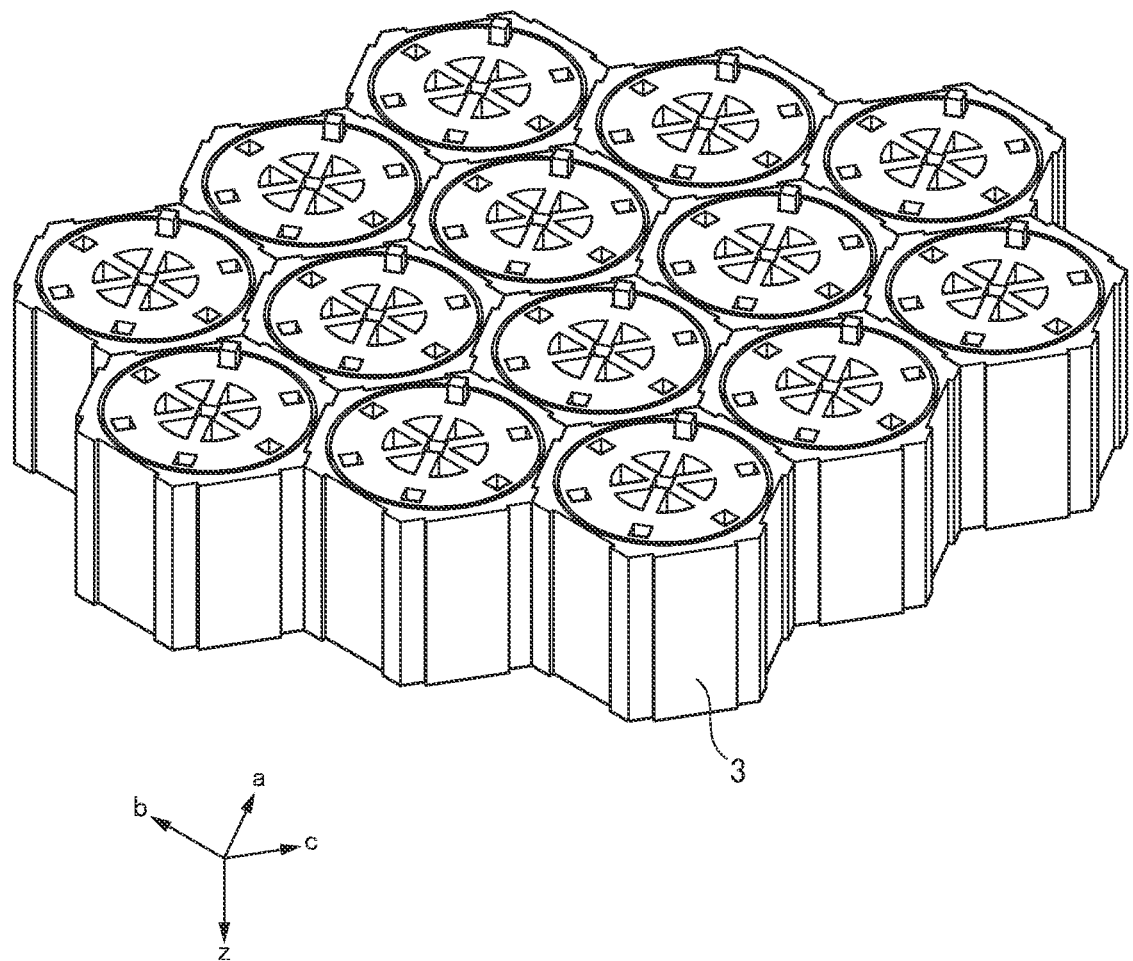
FIG. 22 is a schematic perspective view illustrating a magnetic field detection device array obtained by combining 14 magnetic field detection devices 3.

FIG. 22 is a schematic perspective view illustrating a magnetic field detection device array obtained by combining 14 magnetic field detection devices 3. In the example illustrated in FIG. 22, the engagement portions formed in the side surfaces 310 and 320 of the magnetic field detection device 3 adjacent in the direction a are engaged with each other, the engagement portions formed in the side surfaces 330 and 340 of the magnetic field detection device 3 adjacent in the direction b are engaged with each other, and the engagement portions formed in the side surfaces 350 and 360 of the magnetic field detection device 3 adjacent in the direction c are engaged with each other. As illustrated in FIG. 22, according to the third embodiment, a plurality of the magnetic field detection devices 3 can be arranged in a honeycomb pattern.

While the preferred embodiment of the present invention has been described, the present invention is not limited to the above embodiment, and various modifications may be made within the scope of the present invention, and all such modifications are included in the present invention.

For example, although the magnetic sensors are fixed to the bobbin in the above embodiments, they may be fixed to the cover member having cavities.

Further, although the engagement portion is constituted by steps extending in the z-direction, the shape of the engagement portion is not limited to this. For example, the widths of the first part 111 of the side surface 110 and first part 121 of the side surface 120 in the y-direction may each be made to differ depending on the z-direction position so as to fix the two magnetic field detection devices to be engaged in not only the y-direction but also the z-direction. Further, the side surface 110 of one magnetic field detection device and the side surface 120 of the other magnetic field detection device may be engaged with screws.

Further, although four magnetic sensors for detecting the environmental magnetic field component are provided in the magnetic field detection device 1 according to the first embodiment, the number of the magnetic sensors for detecting the environmental magnetic field component is not particularly limited to a specific number.

REFERENCE SIGNS LIST 1-3 magnetic field detection device
10 bobbin
11, 12 flange part
13 winding core part
14 hollow part
15 circuit board
20 sensor housing body
21 substrate
22 sensor chip
23 magnetism collector
24, 25 insulating film
31 feedback circuit
31a differential amplifier
32 detection circuit
32a differential amplifier
33 voltage measurement circuit
40 cancel space
100 cover member
110, 120, 130, 140 side surface
111, 121, 131, 141 first part
112, 122, 132, 142 second part
113, 123, 133, 143 third part
120 side surface
121 first part
122 second part
150 upper surface
160 lower surface
170 housing part
200 main body part
300 cover member
310, 320, 330, 340, 350, 360 side surface
A0-A4, B0-B6 cavity
C1, C2 cancel coil
F1, F2 feedback current
H sensor head
L0-L4 wiring
M1-M4 magnetoresistance effect element
R1, R2 resistor
S1, S21-S24 magnetic sensor

What is claimed is:

1. A magnetic field detection device comprising:
a bobbin;
a cancel coil wound around the bobbin;
a cover member fixed to the bobbin and covering the cancel coil in a direction perpendicular to an axial direction of the cancel coil;
a first magnetic sensor fixed to the bobbin or cover member;
a second magnetic sensor fixed to the bobbin or cover member; and
a feedback circuit that makes a cancel current flow in the cancel coil according to an output signal of the second magnetic sensor to cancel an environmental magnetic field in a cancel space,
wherein the cover member has first and second side surfaces extending in the axial direction of the cancel coil and positioned on mutually opposite sides,
wherein the first and second side surfaces have first and second engagement portions, respectively,
wherein the first engagement portion has a shape engageable with a shape of the second engagement portion,
wherein the first magnetic sensor is disposed in the cancel space,
wherein sensor heads of the first and second magnetic sensors are different in position in the axial direction of the cancel coil,
wherein the bobbin or cover member has a first cavity opened at one side thereof in the axial direction and a second cavity opened at other side thereof in the axial direction,
wherein the first magnetic sensor is installed in the first cavity, and
wherein the second magnetic sensor is installed in the second cavity.

2. The magnetic field detection device as claimed in claim 1,
wherein the cover member has third and fourth side surfaces extending in the axial direction of the cancel coil and positioned on mutually opposite sides,
wherein the third and fourth side surfaces have third and fourth engagement portions, respectively, and
wherein the third engagement portion has a shape engageable with a shape of the fourth engagement portion.

3. The magnetic field detection device as claimed in claim 2, wherein the first and second side surfaces are perpendicular to the third and fourth side surfaces.

4. The magnetic field detection device as claimed in claim 2,
wherein the cover member has fifth and sixth side surfaces extending in the axial direction of the cancel coil and positioned on mutually opposite sides,
wherein the fifth and sixth side surfaces have fifth and sixth engagement portions, respectively,
wherein the fifth engagement portion has a shape engageable with a shape of the sixth engagement portion, and
the first and second side surfaces, the third and fourth side surface, and the fifth and sixth side surfaces form an angle of 60° with one another.

5. The magnetic field detection device as claimed in claim 1,
wherein a sensor head of the first magnetic sensor protrudes from the bobbin or cover member toward one side in the axial direction, and
wherein a sensor head of the second magnetic sensor protrudes from the bobbin or cover member toward other side in the axial direction.

6. A magnetic field detection device array comprising a plurality of the magnetic field detection devices as claimed in claim 3,
wherein the first engagement portion of one of the plurality of the magnetic field detection devices is engaged with the second engagement portion of another of the plurality of the magnetic field detection devices adjacent to the one of the plurality of the magnetic field detection devices in a first direction perpendicular to the first and second side surfaces, and wherein the third engagement portion of one of the plurality of the magnetic field detection devices is engaged with the fourth engagement portion of another of the plurality of the magnetic field detection devices adjacent to the one of the plurality of the magnetic field detection devices in a second direction perpendicular to the third and fourth side surfaces.

7. A magnetic field detection device array comprising a plurality of the magnetic field detection devices as claimed in claim 4,
wherein the first engagement portion of one of the plurality of the magnetic field detection devices is engaged with the second engagement portion of another of the plurality of the magnetic field detection devices adjacent to the one of the plurality of the magnetic field detection devices in a first direction perpendicular to the first and second side surfaces,
wherein the third engagement portion of one of the plurality of the magnetic field detection devices is engaged with the fourth engagement portion of another of the plurality of the magnetic field detection devices adjacent to the one of the plurality of the magnetic field detection devices in a second direction perpendicular to the third and fourth side surfaces, and
wherein the fifth engagement portion of one of the plurality of the magnetic field detection devices is engaged with the sixth engagement portion of another of the plurality of the magnetic field detection devices adjacent to the one of the plurality of the magnetic field detection devices in a third direction perpendicular to the fifth and sixth side surfaces.

8. A magnetic field detection device array comprising a plurality of the magnetic field detection devices,
wherein each of the plurality of the magnetic field detection devices comprises:
a bobbin;
a cancel coil wound around the bobbin;
a cover member fixed to the bobbin and covering the cancel coil in a direction perpendicular to an axial direction of the cancel coil; and
a first magnetic sensor fixed to the bobbin or cover member,
wherein the cover member has first and second side surfaces extending in the axial direction of the cancel coil and positioned on mutually opposite sides,
wherein the first and second side surfaces have first and second engagement portions, respectively,
wherein the first engagement portion has a shape engageable with a shape of the second engagement portion,
wherein the cover member has third and fourth side surfaces extending in the axial direction of the cancel coil and positioned on mutually opposite sides,
wherein the third and fourth side surfaces have third and fourth engagement portions, respectively,
wherein the third engagement portion has a shape engageable with a shape of the fourth engagement portion,
wherein the first and second side surfaces are perpendicular to the third and fourth side surfaces,
wherein the first engagement portion of one of the plurality of the magnetic field detection devices is engaged with the second engagement portion of another of the plurality of the magnetic field detection devices adjacent to the one of the plurality of the magnetic field detection devices in a first direction perpendicular to the first and second side surfaces, and wherein the third engagement portion of one of the plurality of the magnetic field detection devices is engaged with the fourth engagement portion of another of the plurality of the magnetic field detection devices adjacent to the one of the plurality of the magnetic field detection devices in a second direction perpendicular to the third and fourth side surfaces.

9. A magnetic field detection device comprising:
a bobbin;
a cancel coil wound around the bobbin;
a cover member fixed to the bobbin and covering the cancel coil in a circumferential direction of the cancel coil; and
a first magnetic sensor fixed to the bobbin or cover member,
wherein the cover member has first and second outer side surfaces extending in an axial direction of the cancel coil and positioned on mutually opposite sides,
wherein the first outer side surface includes first, second, and third parts,
wherein the second outer side surface includes fourth, fifth, and sixth parts,
wherein the first part of the first outer side surface is sandwiched between the second and third parts of the first outer side surface such that the first part of the first outer side surface protrudes from the second and third parts of the first outer side surface, and
wherein the fourth part of the second outer side surface is sandwiched between the fifth and sixth parts of the second outer side surface such that the fourth part of the second outer side surface is recessed from the fifth and sixth parts of the second outer side surface.

10. The magnetic field detection device as claimed in claim 9,
wherein the first part of the first outer side surface is sandwiched between the second and third parts of the first outer side surface in a first direction perpendicular to the axial direction, and
wherein the fourth part of the second outer side surface is sandwiched between the fifth and sixth parts of the second outer side surface in the first direction.

11. The magnetic field detection device as claimed in claim 10,
wherein a width of first part of the first outer side surface in the first direction is greater than a width of each of the second and third parts of the first outer side surface in the first direction, and
wherein a width of fourth part of the second outer side surface in the first direction is greater than a width of each of the fifth and sixth parts of the second outer side surface in the first direction.

12. The magnetic field detection device as claimed in claim 10,
wherein the first part of the first outer side surface is opposite to the fourth part of the second outer side surface in a second direction perpendicular to the first direction,
wherein the second part of the first outer side surface is opposite to the fifth part of the second outer side surface in the second direction, and
wherein the third part of the first outer side surface is opposite to the sixth part of the second outer side surface in the second direction.

13. The magnetic field detection device as claimed in claim 10, wherein a width of the fourth part of the second outer side surface in the first direction is substantially equal to or slightly larger than a width of the first part of the first outer side surface in the first direction.

14. The magnetic field detection device as claimed in claim 10, wherein each of the first part of the first outer side surface and the fourth part of the second outer side surface has a flat surface extending in the axial direction and the first direction.

15. The magnetic field detection device as claimed in claim 9,
wherein a first step formed by the first and second parts of the first outer side surface extends in the axial direction,
wherein a second step formed by the first and third parts of the first outer side surface extends in the axial direction,
wherein a third step formed by the fourth and fifth parts of the second outer side surface extends in the axial direction, and
wherein a fourth step formed by the fourth and sixth parts of the second outer side surface extends in the axial direction.

16. The magnetic field detection device as claimed in claim 9, further comprising:
a second magnetic sensor fixed to the bobbin or cover member; and
a feedback circuit that makes a cancel current flow in the cancel coil according to an output signal of the second magnetic sensor to cancel an environmental magnetic field in a first cancel space appearing at one end of the axial direction of the cancel coil and cancel an environmental magnetic field in a second cancel space appearing at another end of the axial direction of the cancel coil.

17. The magnetic field detection device as claimed in claim 16,
wherein the first magnetic sensor is arranged in the first cancel space, and
wherein the second magnetic sensor is arranged in the second cancel space.

18. The magnetic field detection device as claimed in claim 17,
wherein the bobbin or cover member has a first cavity opened at one side thereof in the axial direction and a second cavity opened at other side thereof in the axial direction,
wherein the first magnetic sensor is installed in the first cavity, and
wherein the second magnetic sensor is installed in the second cavity.

19. The magnetic field detection device as claimed in claim 18,
wherein a sensor head of the first magnetic sensor protrudes from the bobbin or cover member toward one side in the axial direction, and
wherein a sensor head of the second magnetic sensor protrudes from the bobbin or cover member toward other side in the axial direction.

* * * * *